(12) United States Patent
Chokhani et al.

(10) Patent No.: US 11,740,284 B1
(45) Date of Patent: Aug. 29, 2023

(54) DIAGNOSING MULTICYCLE FAULTS AND/OR DEFECTS WITH SINGLE CYCLE ATPG TEST PATTERNS

(71) Applicant: Cadence Design Systems, Inc., San Jose, CA (US)

(72) Inventors: Arvind Chokhani, Murphy, TX (US); Joseph Michael Swenton, Owego, NY (US); Martin Thomas Amodeo, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 228 days.

(21) Appl. No.: 17/366,227

(22) Filed: Jul. 2, 2021

(51) Int. Cl.
*G01R 31/3177* (2006.01)
*G06F 30/392* (2020.01)
*G06F 30/31* (2020.01)

(52) U.S. Cl.
CPC ....... *G01R 31/3177* (2013.01); *G06F 30/392* (2020.01); *G06F 30/31* (2020.01)

(58) Field of Classification Search
CPC .... G01R 31/3177; G06F 30/392; G06F 30/31
See application file for complete search history.

(56) References Cited

U.S. PATENT DOCUMENTS

| | | | |
|---|---|---|---|
| 6,694,466 B1 * | 2/2004 | Tsai | G01R 31/318544 714/728 |
| 9,086,454 B2 | 7/2015 | Lin et al. | |
| 10,338,137 B1 * | 7/2019 | Chillarige | G01R 31/318307 |
| 10,372,853 B2 | 8/2019 | Douskey et al. | |
| 11,193,974 B2 * | 12/2021 | Funatsu | G01R 31/3177 |
| 11,579,194 B1 * | 2/2023 | Chokhani | G01R 31/318342 |
| 2003/0084413 A1 | 5/2003 | Varney | |
| 2005/0172189 A1 * | 8/2005 | Ichikawa | G01R 31/318555 714/726 |
| 2005/0172192 A1 | 8/2005 | Han | |
| 2010/0229061 A1 * | 9/2010 | Hapke | G01R 31/318342 714/740 |
| 2013/0232459 A1 | 9/2013 | Wohl et al. | |

(Continued)

OTHER PUBLICATIONS

Irith Pomeranz. 2020. Target Faults for Test Compaction Based on Multicycle Tests. ACM Trans. Des. Autom. Electron. Syst. 25, 2, Article 18 (Jan. 2020), 14 pages. https://doi.org/10.1145/3375278.

*Primary Examiner* — Stacy Whitmore
(74) *Attorney, Agent, or Firm* — Foley & Lardner LLP

(57) ABSTRACT

An integrated circuit (IC) test engine generates single cycle test patterns for testing for candidate faults and/or defects of a first set of static faults and/or defects of an IC design. A diagnostics engine receives single cycle test result data characterizing application of the single cycle test patterns to a fabricated IC chip based on the IC design and fault-simulates a subset of the single cycle test patterns against a fault model that includes multicycle faults and/or defects utilizing sim-shifting to diagnose a second set of static faults and/or defects in the fabricated IC chip that are only detectable with multicycle test patterns. The diagnostics engine further scores candidate faults and/or defects in the first set of static faults and/or defects and the second set of static faults and/or defects for applicable test patterns to determine a most likely fault and/or defect present in the fabricated IC chip.

20 Claims, 8 Drawing Sheets

(56) References Cited

U.S. PATENT DOCUMENTS

| | | | |
|---|---|---|---|
| 2014/0372820 A1* | 12/2014 | Rajski | G01R 31/318575 714/727 |
| 2015/0323600 A1 | 11/2015 | Lin et al. | |
| 2020/0279064 A1 | 9/2020 | Boutobza et al. | |
| 2022/0128628 A1* | 4/2022 | Gizdarski | G01R 31/318357 |

* cited by examiner

FIG. 3

DIAGNOSING MULTICYCLE FAULTS AND/OR DEFECTS WITH SINGLE CYCLE ATPG TEST PATTERNS

TECHNICAL FIELD

This disclosure relates to diagnosing faults and/or defects in integrated circuit (IC) chips. More particularly, this disclosure relates to utilizing single cycle test patterns to diagnose faults and/or defects detectable with multicycle test patterns.

BACKGROUND

As IC chip complexity increases, meeting the testing requirements for acceptable quality assurance is becoming increasingly difficult. Automated testing involves applying test signals to each manufactured circuit in various patterns designed to detect faults and/or defects that cause improper circuit behavior. Although most modern integrated circuits comprise a number of interconnected cells selected from a library, early testing schemes assumed that faults occurred only between cell instances, at the cell I/O ports, or elsewhere outside cells altogether. The test patterns generated therefore did not necessarily include those needed to detect circuit faults inside a cell.

ATPG (acronym for both Automatic Test Pattern Generation and Automatic Test Pattern Generator) is an electronic design automation method/technology used to find an input (or test) sequence that, when applied to a digital circuit, enables automatic test equipment to distinguish between the correct circuit behavior and the faulty circuit behavior caused by defects. The generated patterns are used to test semiconductor devices after manufacture, or to assist with determining the cause of failure. The effectiveness of ATPG systems is measured by the number of modeled defects, or faults, detectable and by the number of generated patterns. These metrics generally indicate test quality (higher with more fault detections) and test application time (higher with more patterns). ATPG efficiency is another consideration that is influenced by the fault under consideration, the type of circuit under test (full scan, synchronous sequential, or asynchronous sequential), the level of abstraction used to represent the circuit under test (gate, register-transfer, switch), and the required test quality.

A defect is an error caused in a device during the manufacturing process which is a physical artifact (e.g., short or open). A fault is a mathematical description of how a defect alters design behavior. Faults representing various defects are aggregated into a fault model, usually sharing some common characteristic with respect to the kind of defects the faults represent. Furthermore, faults are modeled and simulated to generate patterns to detect defects. The logic values observed at the device's primary outputs, while applying a test pattern to some device under test (DUT), are called the output of that test pattern. The output of a test pattern, when testing a fault-free device that works exactly as designed, is called the expected output of that test pattern. A fault is said to be detected by a test pattern if the output of that test pattern, when testing a device that has only that one fault, is different than the expected output. The ATPG process for a targeted fault has two phases: fault activation and fault propagation. Fault activation establishes one or more signal values which, according to the fault description, are required to elicit the defective behavior from the IC chip. For example, a stuck-at-1 pin fault entails initializing the given pin with a value of 0, such that the result of the fault can be seen as a logical value difference in the circuit. Fault propagation moves the resulting signal value, or fault effect, forward by sensitizing a path from the fault site to a primary output and/or an observable scan flop. For example, a path is "sensitized" by ensuring that logic values of 0 and 1 can proceed, unimpeded through the path, usually by setting additional circuit values such that potential logic gates along the way are set to non-controlling values.

A standard cell is a group of transistor and interconnect structures that provides a Boolean logic function (e.g., AND, OR, NOR, NAND, XOR, XNOR, inverters) or a storage function (flipflop or latch). The simplest cells are direct representations of the elemental NAND, NOR and XOR Boolean functions, although cells of much greater complexity are commonly used (such as a 2-bit full-adder, or muxed D-input flipflop). The cell's Boolean logic function is called its logical view: functional behavior is captured in the form of a truth table or Boolean algebra equation (for combinational logic), or a state transition table (for sequential logic).

Scan chains are the elements in scan-based designs of IC chips that are used to shift-in and shift-out test data. The test data includes both input stimulus applied to an IC chip under test as well as associated output responses. A scan chain is formed by a number of scan flops connected back to back in a chain with the output of one scan flop connected to another, An input of a first scan flop is connected to a channel input. The channel input can be driven by a pin of the IC chip (referred to as a scan-in pin) from which scan data is fed or by a scan decompressor output. In such a situation, an input of the scan decompressor can be connected to a scan-in pin of the IC chip. Scan-in inputs of the IC chip can be directly controlled by automatic test equipment (ATE). The output of a last scan flop is connected to an output pin of the chip (referred to as a scan-out pin) or to the input pin of a scan compressor, which in turn can drive the scan-out pin of the IC chip. The scan-out pin is used to observe and/or measure shifted data out and is provided to an output pin of the IC chip. Output pins of the IC chip can be directly observed with the ATE.

A scan flop or scan flip-flop (SFF) in a scan chain can be a muxed input master-slave based D flip-flop that allows its input to come from a data port (D) or from an alternative source, namely, as scan-input (SI) port. A scan enable signal (SE) controls the scan flop. More particularly, if the scan enable signal is asserted (e.g., logical 1), the scan flop passes data received at the scan-input (SI) port to an output port (Q) of the scan flop. Conversely, if the scan enable signal is de-asserted (e.g., logical 0), the scan flop passes data received at the data port (D) to the output port. In this manner, the scan flop is employable in a scan chain to test an IC chip, and is employable for functional operation of the IC chip.

SUMMARY

One example relates to a non-transitory machine-readable medium having machine-readable instructions. The machine readable instructions include an IC test engine that generates single cycle test patterns for testing for candidate faults and/or defects of a first set of static faults and/or defects of an IC design. The machine readable instructions also include a diagnostics engine that receives single cycle test result data characterizing application of the single cycle test patterns to a fabricated IC chip based on the IC design by ATE, in which the test result data includes a set of miscompare values characterizing a difference between an expected result and a result measured by the ATE for a given single cycle test pattern of the single cycle test patterns. The diagnostics engine employs a fault simulator to fault-simulate a first subset of the single cycle test patterns against a single cycle fault model to diagnose a second set of static faults and/or defects. Additionally, the diagnostics engine employs the fault simulator to fault-simulate a second subset of the single cycle test patterns against a fault model that includes multicycle static faults and/or defects with sim-shifting to diagnose a third set of static faults and/or defects in the fabricated IC chip that are only detectable with multicycle test patterns. The diagnostics engine scores candidate faults and/or defects in the first set of static faults and/or defects, the second set of static faults and/or defects and the third set of static faults and/or defects for applicable test patterns of the first and second subsets of the single cycle test patterns to determine a most likely fault and/or defect present in the fabricated IC chip.

Another example relates to a system that includes ATE that applies single cycle test patterns to a fabricated IC chip that is based on an IC design and provides single cycle test result data characterizing application of the single cycle test patterns to the fabricated IC chip, in which the test result data includes a set of miscompare values characterizing a difference between an expected result and a result measured by the ATE for a given single cycle test pattern of the single cycle test patterns. The system also includes a non-transitory memory that stores machine-readable instructions and a processing unit that accesses the memory and executes the machine-readable instructions. The machine-readable instructions include an IC test engine that generates the single cycle test patterns for testing for candidate faults and/or defects of a first set of static faults and/or defects of the IC design. The machine readable instructions also include a diagnostics engine that employs a fault simulator to fault-simulate a subset of the single cycle test patterns against a fault model that includes multicycle static faults and/or defects utilizing sim-shifting to diagnose a second set of static faults and/or defects in the fabricated IC chip that are only detectable with multicycle test patterns. The diagnostics engine scores candidate faults and/or defects in the first set of static faults and/or defects and the second set of static faults and/or defects for applicable test patterns of the subset of the single cycle test patterns to determine a most likely defect present in the fabricated IC chip.

Yet another example relates to a method for diagnosing faults and/or defects in a fabricated IC chip. The method includes generating, by an IC test engine operating on a computing platform, single cycle test patterns for testing for candidate faults and/or defects of a first set of static faults and/or defects of an IC design. The method also includes applying, by ATE the single cycle test patterns to a fabricated IC chip that is based on the IC design and provides single cycle test result data characterizing application of the single cycle test patterns to the fabricated IC chip, in which the test result data includes a set of miscompare values characterizing a difference between an expected result and a result measured by the ATE for a given single cycle test pattern of the single cycle test patterns. The method further includes selectively fault-simulating, by a diagnostics engine operating on the computing platform, a subset of the single cycle test patterns against a fault model that includes multicycle static faults and/or defects utilizing sim-shifting to diagnose a second set of static faults and/or defects in the fabricated IC chip that are only detectable with multicycle test patterns. The method yet further includes scoring, by the diagnostics engine candidate faults and/or defects in the first set of static faults and/or defects and the second set of static faults and/or defects for applicable test patterns of the subset of the single cycle test patterns to determine a most likely defect present in the fabricated IC chip.

BRIEF DESCRIPTION OF THE DRAWINGS

FIG. 3 illustrates an example of a defect detection matrix (DDM) for a cell.

DETAILED DESCRIPTION

Figure 1:
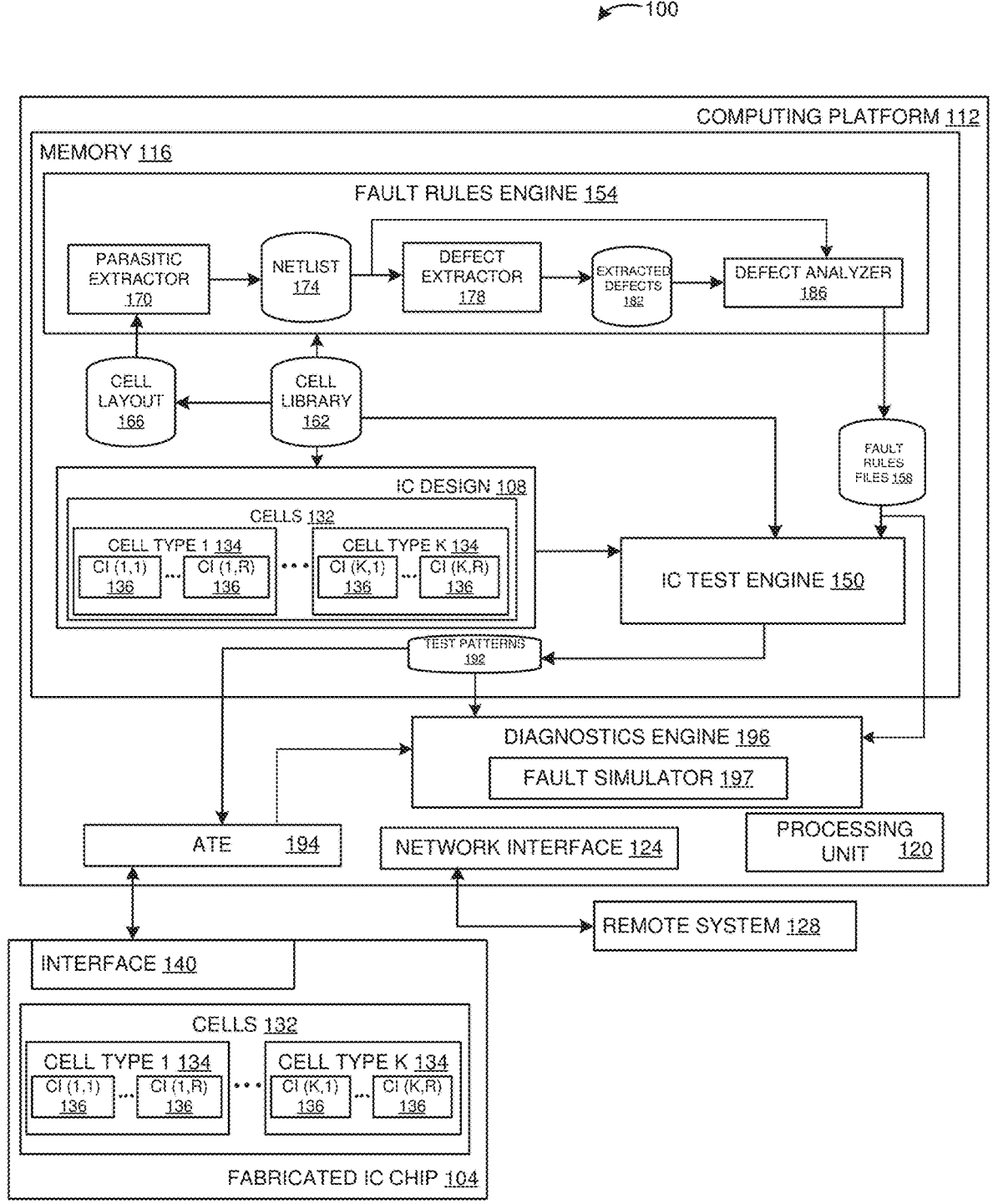
FIG. 1 illustrates an example of a system for diagnosing faults and/or defects in a fabricated IC chip that is based on an IC design.

This disclosure relates to a system for diagnosing faults and/or defects of a fabricated IC chip that are based on an IC design. More particularly, this disclosure relates to employing sim-shifting of single cycle test patterns to diagnose faults and/or defects that are conventionally only detectable with a multicycle test pattern. The system includes an IC test engine that generates single cycle test patterns for testing for candidate faults and/or defects of a first set of static faults and/or defects of an IC design. The system also includes an ATE that applies the plurality of single cycle test patterns to a fabricated IC chip that is based on the IC design and provides single cycle test result data characterizing application of the single cycle test patterns to the fabricated IC chip. If failures are detected by ATE during application of the single cycle test patterns, the test patterns and the single cycle test result data are provided to a diagnostics engine to find the fault(s)/defect(s) which best explains the cause of failures in the fabricated IC chip on the ATE. The test result data includes a miscompare value (or multiple miscompare values) characterizing a difference between an expected result and a result measured by the ATE for a corresponding single cycle test pattern of the plurality of single cycle test patterns. More specifically, a "miscompare value" refers to a value recorded in the test result data that identifies differences, or "miscompares", between expected values at observable scan flops and primary outputs (as determined by an ATPG engine and a diagnostics engine), and the values measured from the IC chip on the ATE.

To execute the diagnostics, the diagnostics engine employs a fault simulator to fault-simulate a subset of the single cycle test patterns against possible faults and/or defects potentially detected by the given subset of single cycle test patterns. This includes fault-simulating the subset of single cycle test patterns against single cycle faults/defects and multicycle faults/defects. The diagnostics engine utilizes sim-shift techniques to diagnose a set of multicycle static faults and/or defects in the fabricated IC chip that are conventionally detectable only with multicycle test patterns. The diagnostics engine scores the candidate faults/defects applicable to the subset of the single cycle test patterns to determine the most likely fault/defect (or multiple faults/defects) present in the fabricated IC chip.

A single cycle test pattern has only one clock pulse during a capture window and a multicycle test pattern has two or more clock pulses during the capture window to detect faults/defects. For each such test pattern (single cycle or multicycle), the capture window is preceded by a shift window which includes one or more scan shift cycles. During the shift window, clock speeds are typically slow (e.g., about 50 MHz) and a shift enable signal is asserted. Conversely, during the capture window, clock speeds are usually much faster (e.g., by one or more orders of magnitude) for multicycle at-speed delay test patterns, and the shift enable signal is de-asserted.

A single cycle test pattern can detect static faults/defects and has only one clock pulse during the capture window where a scan enable signal is typically de-asserted. The last scan shift cycle prior to the capture window sets the correct static conditions to detect a fault or defect (fault excitation) while the clock pulse during the capture window (capture pulse) allows observing the fault effect on a primary output or observable scan flop(s). As noted, a multicycle test pattern employs two or more cycles to detect faults/defects during the capture window. The last clock pulse during the capture window of a multicycle test pattern is defined as a capture cycle while the prior cycles are defined as launch cycles (or release cycles). The launch cycle creates the transition (fault excitation) at the fault site required to detect a fault or defect. The last scan shift cycle in the shift window sets the initial values (fault initialization) which enables the creation of the transition during the launch cycle. During the shift window, clock speeds are typically slow (e.g., 50 MHz or less) and the scan enable signal is asserted. During the capture window, the scan enable is typically de-asserted and clocks operate at functional speed, which is usually at least one order of magnitude faster. Additionally, the diagnostics engine scores the candidate defects applicable to the subset of the test patterns to determine the most likely fault/defect present in the fabricated IC chip.

Sim-shifting the single cycle test pattern entails fault-simulating one or more scan shift cycles prior to the capture pulse of the single cycle test pattern as fault initialization and excitation cycles and employing the capture pulse as a fault observation cycle to detect a fault/defect which otherwise requires multiple clock pulses during the capture window of the single cycle test pattern. If the fault excitation creates the transition required to detect the fault/defect and the final state of the transition can be observed during the capture pulse, then sim-shifting results in that fault/defect detection. In this manner, the single cycle test pattern mimics the operation of a multicycle test pattern for a multicycle static fault/defect (e.g., a static cell-aware defect), such that the same single cycle test pattern is employable to detect single cycle fault(s)/defect(s) and multicycle fault(s)/defect(s). Stated differently, sim-shifting of the single cycle test pattern during diagnostics enables such single cycle test patterns to be utilized to diagnose multicycle faults/defects (such as multicycle cell-aware defects) that conventionally are only diagnosable with a multicycle test pattern. More particularly, the systems and methods described herein enable the fault simulator of the diagnostics engine to recognize that single cycle test patterns are employable to detect multicycle faults/defects, and to assign appropriate credit to the single cycle test patterns, which obviates the need to explicitly target multicycle defects and generate unnecessary multicycle tests.

To score the candidate faults/defects, the diagnostics engine employs a fault simulator to fault-simulate the single cycle test patterns against the applicable faults/defects including both single cycle faults/defects and multicycle faults/defects to determine a probability that miscompare value(s) of the single cycle result data from ATE is caused by a given fault/defect.

The diagnostics engine utilizes sim-shift techniques to fault-simulate single cycle patterns against multicycle static defects in the fabricated IC chip that are conventionally detectable only with multicycle test patterns. The diagnostics engine scores the candidate fault/defect with the greater probability higher. A fault/defect with a highest score is the most likely present fault/defect in the fabricated IC chip. In this manner, multicycle defects present in the fabricated IC chip that are conventionally only diagnosable with multicycle test patterns are diagnosed with the sim-shifting of single cycle ATPG test patterns. A fault/defect with a higher score is more likely to explain the miscompare value(s) recorded in the result data, and thus, more likely to exist in the fabricated IC chip.

FIG. 1 illustrates an example of a system 100 for diagnosing faults and/or defects in a fabricated IC chip 104 that is based on an IC design 108. The system 100 can include a computing platform 112. Accordingly, the computing platform 112 can include a memory 116 for storing machined readable instructions and data and a processing unit 120 for accessing the memory 116 and executing the machine-readable instructions. The memory 116 represents a non-transitory machine-readable memory (or other medium), such as random access memory (RAM), a solid state drive, a hard disk drive or a combination thereof. The processing unit 120 can be implemented as one or more processor cores. The computing platform 112 can include a network interface 124 (e.g., a network interface card) configured to communicate with other computing platforms via a network, such as a public network (e.g., the Internet), a private network (e.g., a local area network (LAN)) or a combination thereof (e.g., a virtual private network).

The computing platform 112 could be implemented in a computing cloud. In such a situation, features of the computing platform 112, such as the processing unit 120, the network interface 124, and the memory 116 could be representative of a single instance of hardware or multiple instances of hardware with applications executing across the multiple of instances (e.g., distributed) of hardware (e.g., computers, routers, memory, processors, or a combination thereof). Alternatively, the computing platform 112 could be implemented on a single dedicated server or workstation.

The IC design 108 can be stored in the memory 116 of the computing platform 112. The IC design 108 can be implemented, for example, as design specifications for an IC chip. The IC design 108 can be generated with an electronic design automation (EDA) application operating on a remote system 128, such as a logic synthesis application (e.g., a synthesis tool). For instance, an end-user of the EDA application can employ a user-interface to generate and/or modify hardware description language (HDL) code (e.g., Verilog) for generating a register-transfer level (RTL) model (e.g., RTL code) characterizing a circuit, wherein the RTL model is transformable by an EDA application into a physically realizable gate-level netlist for the IC design 108.

As noted, in the examples described, the fabricated IC chip 104 represents a physically instantiated version of the IC design 108. More particularly, the fabricated IC chip 104 and the IC design 108 can include intellectual property (IP) blocks formed of cells 132. Each of the cells 132 (alternatively referred to as standard cells), can represent a group of transistor and interconnect structures that provides a Boolean logic function (e.g., AND, OR, NOR, NAND, XOR, XNOR, inverters) or a storage function (e.g., flipflop or latch). The cells 132 of the fabricated IC chip 104 represent physically instantiated versions of the cells 132 of the IC design 108. Thus, the cells 132 of the IC design 108 and the cells 132 of the fabricated IC chip 104 employ the same reference numbers. In many instances, there can be virtually any number of cells 132 (e.g., hundreds, thousands or millions).

In the present example, there are K number of different cell types 134 of the cells 132, where K is an integer greater than or equal to one. Additionally, there are R number of cell instances 136 for each of the K number of cell types 134, where R is an integer greater than or equal to one. Each cell instance 136 represents a specific instantiation in the IC design 108 for a corresponding cell type 134. Moreover, there can be a different (or the same) number of cell instances 136 for each of the K number of cell types 134.

For purposes of simplification of explanation, each of the cell instances 136 includes a unique identifier implemented as a two-dimensional index number, i,j, where i identifies the cell type 134 and j identifies the cell instance number for the cell type 134. For instance, the cell instance 136 labeled as CI (1,R) uniquely identifies the Rth cell instance of cell type 1. Similarly, the cell instance 136 labeled as CI (K,1) uniquely identifies the first cell instance 136 of the Kth cell type 134.

The fabricated IC chip 104 can include an interface 140 that enables external systems to provide stimuli to the components of the fabricated IC chip 104, including the cells 132 of the fabricated IC chip 104. The interface 140 can conform to the standards set forth in the IEEE 1149.1 standards and/or the IEEE 1149.6 standards, and can be implemented with PCI, wafer probes, etc.

The memory 116 includes an IC test engine 150 which can be implemented as application software or a software module. The IC test engine 150 is configured to generate and execute employ ATPG techniques to generate boundary model and cell-aware test patterns that can be applied to the fabricated IC chip 104 to ensure proper operation.

The IC test engine 150 can operate in concert with a fault rules engine 154 stored in the memory 116. The fault rules engine 154 can be configured/programmed to generate fault rules files 158. In some examples, the fault rules engine 154 generates Defect Detection Matrices (DDMs) that each represents a user-readable format of a corresponding fault rules file 158. Each fault rules file 158 represents a set of fault rules for a particular cell type 134 of the K number of cell types 134 that is selected from a cell library 162. The cell library 162 can include, but is not limited to, data characterizing a physical layout of each of the K number of cell types 134 in the cells 132 of the IC design 108 and the fabricated IC chip 104. The cell library 162 can also include structural Verilog (.v), behavioral Verilog (.v) and timing models (.lib).

To generate the fault rules files 158, the fault rules engine 154 can read a cell layout 166 from the cell library 162. The cell layout 166 corresponds to a physical layout view of the standard cell type 134 in terms of mask polygons containing the geometrical data required to instantiate the fabricated IC chip 104. The fault rules engine 154 generates a particular fault rules file 158 of the fault rules files 158 based on the cell identified in the cell layout 166.

The fault rules engine 154 can represent a plurality of software applications that operate in an ordered sequence to generate each instance of the fault rules file 158. In particular, the cell layout 166 can be received by a parasitic extractor 170. The parasitic extractor 170 generates a transistor-level netlist 174 of the cell represented by the cell layout 166. The parasitic extractor 170 utilizes the cell layout 166, along with other fabrication technology-related information available in the cell library 162 to generate the transistor level netlist 174. The netlist 174 is a textual description of the standard cell type 134 in terms of its designed devices (e.g., transistors), input output pins and their inter-connections. The netlist 174 also includes unavoidable parasitic resistors (Rs) and capacitors (Cs) inherent to a standard cell type 134 extracted by the parasitic extractor 170. The parasitic resistors, for example, can be extracted on the wires and inter-connects and for the terminals of a transistor e.g. drain, gate, source, bulk. The parasitic extractor 170 can extract parasitic capacitors between wires on the same layer (intra-layer), between layers (inter-layer) or across transistor terminals e.g. drain-gate, drain-source, bulk-drain, etc. The netlist 174 can be provided in the Detailed Standard Parasitic Format (DSPF).

The fault rules engine 154 can include a defect extractor 178 that can analyze the netlist 174 to identify parasitic resistors and capacitors to be modeled as potential open and short defects for the standard cell type 134 to provide extracted defects 182. The extracted defects 182 can include data for modeling each of the defects identified in the netlist 174. For instance, a large parasitic resistor indicates a long and thin wire segment that can undergo an unintended break, and hence is a potential 'open' defect site. A large parasitic capacitance between two nets or wire segments indicates that the two nets or wires are relatively close to one another and along a relatively long distance, hence can be potentially shorted. An open defect is modeled with a high ohmic resistance (e.g. 1 G Ohm), and a short is modeled with a very low resistance (e.g., 0.001 Ohm).

The extracted defects 182 from the netlist 174 can be provided to a defect analyzer 186 that characterizes each of the extracted defects 182 in the netlist 174. More particularly, the defect analyzer 186 simulates operation of a circuit representing the cell layout 166 for each instance of the extracted defects 182. For example, the defect analyzer 186 can simulate operation of the circuit representing a particular cell with each parasitic capacitor and/or resistor being set to a fault/defect free value, and open or a short. The defect analyzer 186 can identify transition faults/defects as well as static faults/defects in one of the K number of cell types 134 characterized by the cell layout 166. Transition faults/defects characterize faults/defects wherein a component within the cell reaches an expected value slower than is acceptable. Conversely, static faults/defects refer to faults/defects that cause a circuit component to not reach an expected value within the typically used tester cycle period (e.g. 20 ns for a 50 MHz tester cycle). Throughout this disclosure, unless otherwise noted the faults/defects analyzed by the defect analyzer 186 refer to static faults/defects. The defect analyzer 186 outputs an instance of the fault rules file 158 based on the results of the analysis. The fault rules engine 154 can repeat operations to iteratively generate the fault rules files 158 for each cell type 134 in the K number of cell types 134.

To facilitate understanding of the operations of the fault rules engine 154, a given extended example ("the given example") is provided and explained with respect to FIGS.

2-3. The given example illustrates and describes how a fault rules file can be generated for an AND gate cell.

Figure 2:
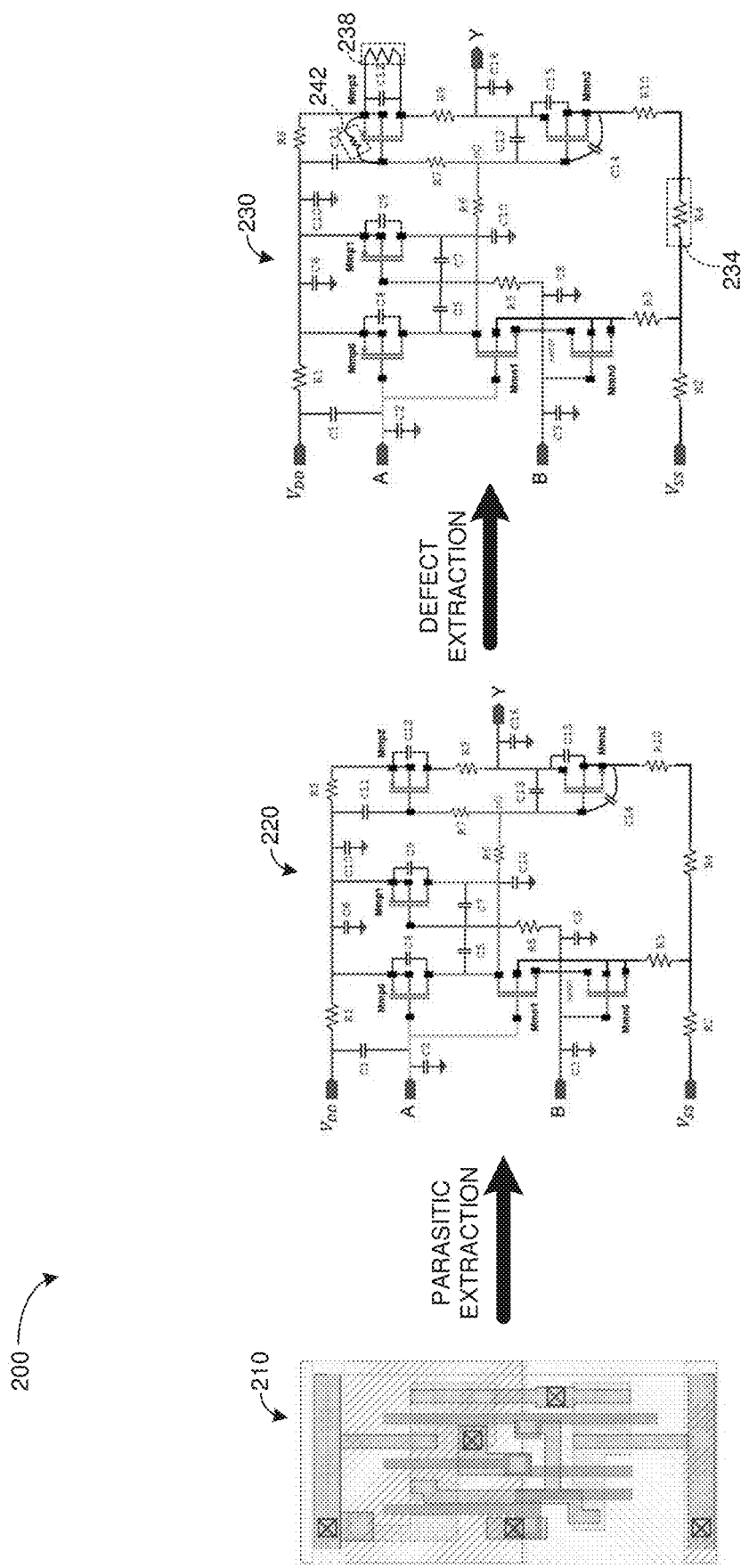
FIG. 2 illustrates diagrams depicting a flow for extracting potential faults and/or defects in a cell.

FIG. 2 includes diagrams depicting a flow 200 for extracting potential faults/defects in a cell in the given example. FIG. 2 includes a physical cell layout 210 for an AND gate. The physical cell layout 210 characterizes the physical layout of an IC chip that physically instantiates the AND gate. More particularly, the physical cell layout 210 includes connection points and traces that form the AND gate.

A parasitic extractor, such as the parasitic extractor 170 of FIG. 1 can analyze the physical cell layout 210 to generate a transistor-level netlist of the physical cell layout 210. The transistor-level netlist provides data sufficient to generate a circuit diagram 220 for the physical cell layout 210. The parasitic extractor analyzes the netlist to identify and extract parasitic components in the cell represented by the circuit diagram 220. These parasitic resistors and capacitors are not intended by the designer of the cell, but exist in a fabricated IC chip that employs the cell. Parasitic capacitance, or stray capacitance is an unavoidable (and usually unwanted) capacitance that exists because of a proximity of circuit components, such as wires, interconnects between transistor terminals, etc. Similarly, all conductors (e.g. wires, interconnects) in the physical cell layout 210 possess some unavoidable parasitic resistance. The parasitic extractor extracts (or models) these parasitic resistors and capacitors in the circuit diagram 220. In this manner, the parasitic extractor generates an accurate analog model for the physical cell layout 210 that is characterized in the circuit diagram 220, which analog model is employable to emulate circuit responses in detailed simulations of the circuit diagram 220.

The parasitic extractor identifies (marks) node in the netlist with the parasitic components that coincide with possible fault/defect sites. Thus, the parasitic extractor augments the netlist with data that includes the identification of parasitics extracted from the netlist. In the given example, the parasitic extractor analyzes the circuit diagram 220 to provide a circuit diagram 230 that includes specific identification of a resistor R4 234 in the netlist as a parasitic component.

The netlist in DSPF that identifies parasitics can be provided to a defect extractor, such as the defect extractor 178 of FIG. 1. The defect extractor employs the parasitics identified in the netlist to model potential open and short defects within a standard cell. More particularly, the defect extractor can analyze the identified parasitics and generate a fault for each identified parasitic in the netlist, or some subset thereof. Additionally, the defect extractor searches the circuit diagram 220 to identify nets that are relatively long which could form a parasitic resistor and/or nets that are relatively close and running parallel over long distance, which could form a parasitic capacitor. These parasitic capacitors have a high probability of corresponding to probable short and open locations as a result of defects induced during fabrication. That is, the defect extractor can identify locations in the netlist that have a higher probability of corresponding to manufacturing defects.

The fault for each parasitic resistor can represent an instance of a circuit design wherein a respective parasitic resistor is modeled as an open (e.g. a resistor with a resistance of 1 G Ohm). Examples of such modeled opens can include, but are not limited to opens at a drain, gate, source and bulk terminals on FETs, and opens on each branch of interconnected nets including signaling nets and between power-ground nets. Additionally, the fault for each parasitic capacitor can be represented as an instance of the circuit design wherein a respective parasitic capacitor is modeled as a short (e.g., a resistor with a resistance of 0.001 Ohms). The examples of such modeled shorts can include, but are not limited to shorts across FET terminal pairs, including drain-source, drain-gate, source-gate, bulk-drain, bulk-gate and bulk-source pairs. The examples of such model shorts also include shorts across each possible interconnected net pairs, signal nets on the same layer (e.g., intralayer shorts), shorts between power-ground nets (e.g., power-ground shorts) and shorts between adjacent layers (e.g., inter-layer shorts). The defect extractor can provide extracted faults/defects, such as the extracted defects 182 of FIG. 1 that identifies the location of faults/defects modeled by the defect extractor. In the given example, the resistor R4 234 can be modeled as an open circuit in one fault of the circuit design. In another fault of the circuit design, the capacitor C12 238 or the transistor terminals of MMP2 242 can be modeled as a short. That is, the defect extractor generates multiple versions of a circuit representing a cell, wherein each version (a fault) includes an open or a short replacing a particular parasitic resistor or parasitic capacitor. Each of the faults can be aggregated into the extracted faults/defects that can be provided to a defect analyzer, such as the defect analyzer 186 of FIG. 1.

The defect analyzer can employ the extracted faults/defects characterized with faults to generate a DDM and a fault rules file that characterizes a detectability of each fault identified in the netlist, or some subset thereof. More particularly, the defect analyzer can employ fault analysis to generate the DDM and the fault rules file for the cell. In the given example, it is presumed that there are 41 potential faults. The defect analyzer applies a set of two-cycle test patterns for each potential fault to determine whether a fault/defect is detectable, and if the fault is detectable, to determine if the fault/defect is a static fault/defect or a transient fault/defect. Moreover, if the fault is a static fault/defect, the defect analyzer can determine if the fault/defect is detectable with a single cycle test pattern or if a multicycle test pattern is needed.

In the given example, the circuit diagram 220 includes input nodes labeled A and B and an output node labeled Y. As noted, in the given example, the cell represents an AND gate. Thus, an instance of the cell with no faults/defects should provide an output of a logical one on node Y if, and only if nodes A and B have a logical one applied there-on. Additionally, node Y should output a logical 0 for all other combinations of logical values applied to nodes A and B. To generate the DDM and the fault rules file, the defect analyzer simulates instantiations of the cell that have particular faults/defects and analyzes whether a particular fault/defect impacts an output of a cell based on the application of two-cycle test patterns applied to the input nodes (nodes A and B in the given example). The defect analyzer can be configured to apply multiple two-cycle test patterns for each candidate fault/defect identified in the netlist. The results can be aggregated to form a DDM and a fault rules file for the cell.

Figure 3:
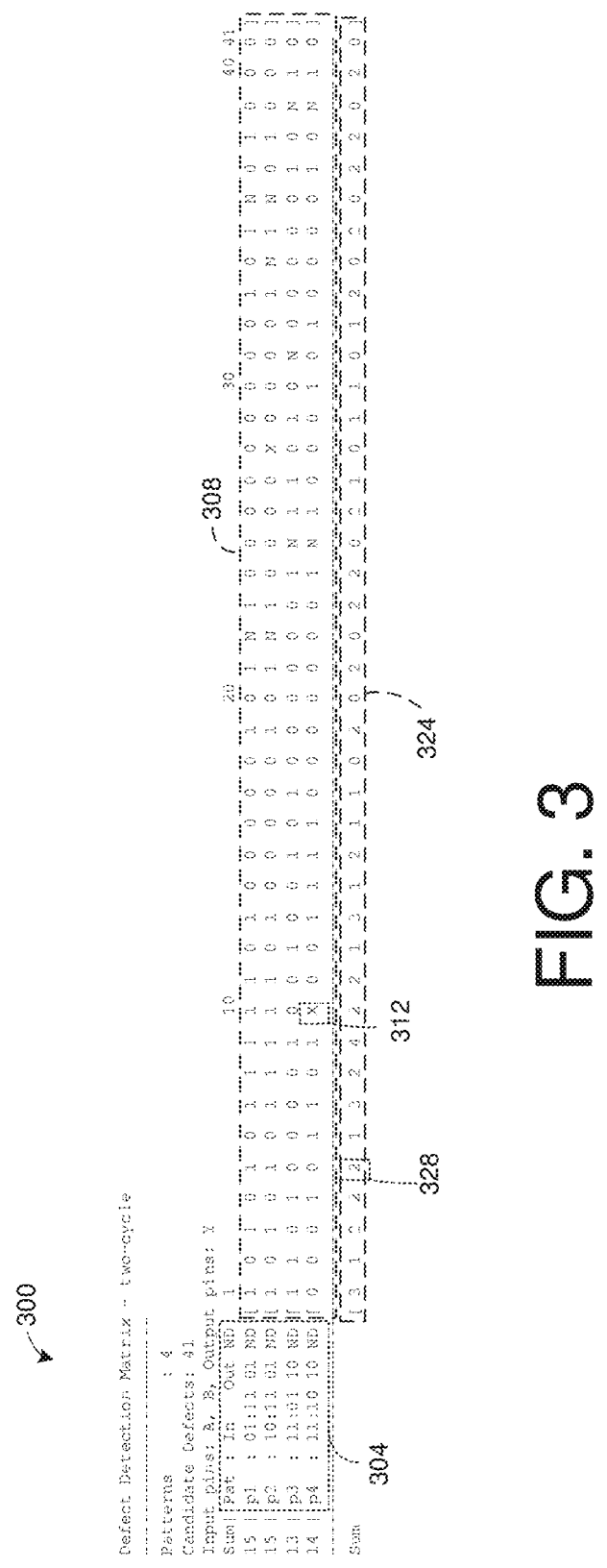

FIG. 3 illustrates an example of a DDM that could represent the cell (an AND gate) in the given example. In the DDM 300, a first box 304 identifies and characterizes four two-cycle test patterns, labeled p1 . . . p4. For instance, in the given example, the two-cycle test pattern p1 is labeled as (In) 01:11, (Out) 01 and (ND) "ND". This labeling indicates that in a first test pattern, a logical 0 is applied to node A, and a logical 1 is applied to node B, and that an expected response at the output node, Y is a logical 0. Additionally, this labeling also indicates that in a second test pattern, a logical 1 is applied to node A and to node B, and that the expected response at the output node, Y is a logical 1. Furthermore, the labeling "ND" of p1 represents a recorded nominal delay, Delaynom for the test pattern, p1 (e.g., the transition delay for a defect-free version of the cell). Values at "ND" are stored as integer or fixed point/floating point values. Moreover, in some examples, the nominal delay, Delaynom can be omitted.

Additionally, the DDM 300 includes a 41 by 4 results matrix 308 wherein each of the 41 columns represents a recorded result of a corresponding two-cycle test pattern for a particular candidate fault/defect. That is, each column represents a response to four two-cycle test patterns, p1 . . . p4 by a particular version of the cell where one fault/defect is modeled. Values in the results matrix 308 of the DDM 300 recorded as a 0 indicate that the particular fault/defect did not have a detectable change on the operation of a cell for a corresponding test pattern. For instance, the value stored in the results matrix 308 at column 3, row 3 indicates that the two-cycle test pattern p3 (11:01; 10; "ND") in the first box 304 has a value of 0. This indicates that the two-cycle test pattern, p3 is not employable to detect the particular candidate fault/defect modeled in column 3.

Additionally, values in the results matrix 308 of the DDM 300 recorded as a 1 indicate that the particular fault/defect is a static fault/defect detected by the corresponding test pattern. For instance, the value stored at column 4, row 4 indicates that the two-cycle test pattern p4 (11:10; 10; "ND") has a value of 1. This indicates that the two-cycle test pattern, p4 is employable to detect static fault/defect for the particular candidate fault/defect model in column 4.

A recorded value of 'X' in the results matrix 308 indicates that the corresponding test pattern is not employable to detect a fault/defect caused by the candidate fault/defect of the corresponding column due to non-convergence, where the solution from fault analysis was indeterminant. Furthermore, in the given example, the value at column 10, row 4 in a second box labeled 312 is set to 'X', indicating that due to non-convergence, the two-cycle test pattern p4 is not employable to detect a fault/defect caused by the particular candidate fault/defect modeled in column 10. Further, a recorded value of 'N' represents a percent deviation or a time deviation (e.g., in μs, ns or ps) from a corresponding nominal delay 'ND' caused by applying a corresponding test pattern for a particular candidate fault/defect. Moreover, in some examples, the values of 'N' may be omitted.

The DDM 300 also includes a one row sum matrix 324 that stores integer values characterizing a number of test patterns p1 . . . p4 that are employable to detect a particular static fault/defect. For instance, in a box 328, a value of 2 is stored at column 5 of the one row sum matrix 324 of the DDM 300. This value indicates that two different two-cycle tests (namely p1 and p2) are employable to detect the candidate fault/defect modeled in column 5. As noted, the defect analyzer generates a fault rules file that corresponds to the DDM 300. The fault rules file provides similar information as the DDM 300 in a format consumable by an IC test engine, such as the IC test engine 150 of FIG. 1.

Referring back to FIG. 1, the fault rules files 158 for each of the K number of cell types 134 of the cells 132 included in the IC design 108 are provided to the IC test engine 150 for the generation of test patterns for the fabricated IC chip 104 using ATPG techniques. In the examples provided, the test patterns generated by the IC test engine 150 are boundary model (non-cell-aware) single cycle test patterns. Conversely, test patterns from a DDM, such as the DDM 300 of FIG. 3 are considered cell-aware test patterns. Such test-patterns are considered "cell-aware" because the cell-aware test patterns are generated based on candidate faults/defects within boundaries of the cells 132 of the IC design 108. That is, rather than the boundary model test patterns that treat each cell as a "black box", the cell-aware test patterns are tailored for specific fault/defect candidates that are possible based on the internal circuit design of cells.

As used herein, defects or faults that are characterized as "single cycle" refer to defects and faults, respectively in the fabricated IC chip 104 and the IC design 108 that are detectable with a single cycle test pattern. Additionally, defects or faults that are characterized as "multicycle" refer to defects and faults, respectively in the fabricated IC chip 104 and the IC design 108 that require a value transition (or multiple value transitions) for testing and are conventionally only detectable with a multicycle test pattern. However, through sim-shifting, single cycle test patterns generated by the IC test engine 150 are employable to diagnose both single cycle faults/defects as well as multicycle faults/defects. More particularly, the diagnostics engine could perform fault simulation on a single cycle test pattern utilizing sim-shifting. The diagnostics engine determines if a scan shift cycle prior to a capture cycle of the given single cycle test pattern creates a transition, also referred to as fault excitation, that is needed to detect particular multicycle faults/defects and the capture cycle enables observation of the transition on a primary output pin and/or at an observable scan flop. Additionally, the shift cycles prior to the last shift cycle may be fault-simulated for multicycle defects which require two or more cycles for detection.

As will be explained, the single cycle static test patterns are employable in place of cell-aware (or boundary model) multicycle test patterns. A single cycle test pattern has one or more scan shift cycles when shift enable is asserted (shift window) and a single capture cycle (e.g., a single clock pulse) where shift enable is de-asserted (capture window). A multicycle test pattern includes one or more shift cycles (shift window) and N capture cycles (capture window), where N is an integer greater than or equal to two. Moreover, a cycle (e.g., cycle N−1) during the capture window in a multicycle test pattern is the fault excitation cycle which creates the transition on a cell pin (e.g., alternatively referred to as a cell node) needed to detect a fault or defect and another cycle (e.g., cycle N) captures the transition on a primary output pin or on an observable scan flop (or multiple observable scan flops). Additionally, the remaining cycles of the capture window, namely cycle 1 to cycle N−2, are fault initialization cycles which facilitate the needed conditions for the fault or defect to be detected. More specifically, the cycle N−1 is also referred to as a launch cycle that creates the transition on the node of a cell needed to detect a fault or defect. Furthermore, the cycle N is also referred to as a capture cycle which captures (or observes) the fault or defect on a primary output pin or observable scan flop(s). As one example, in a two-cycle test pattern (such that N is equal to 2), the capture cycle is cycle 2 (cycle N), and the launch cycle is cycle 1 (cycle N−1). As another example, in a three-cycle test pattern (such that N is equal to 3), the capture cycle is cycle 3 (cycle N), the launch cycle is cycle 2 (cycle N−1), and cycle 1 is the fault initialization cycle. In still another example, in a ten cycle test pattern (such that N is equal to 10), the capture cycle is cycle 10 (cycle N), the launch cycle is cycle 9 (cycle N−1) and cycles 1-8 (cycles 1 to N−2) are fault initialization cycles.

Figure 4:
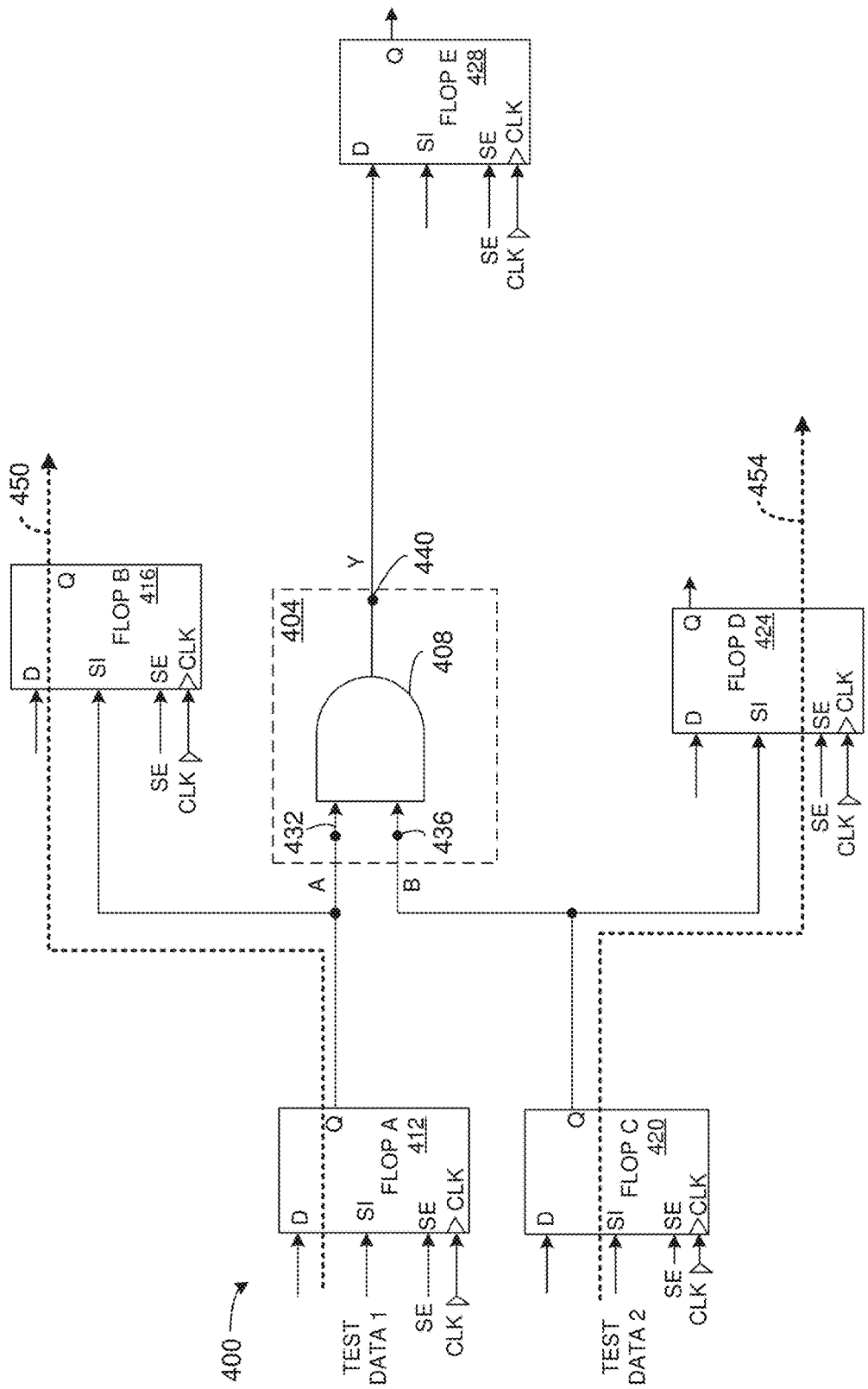
FIG. 4 illustrates an example of a scan chain for testing a candidate defect in an IC design.

A scan chain is formed of scan flops that are included in the IC design 108 to propagate test patterns through the IC design 108. Moreover, some such static defects require multiple cycles of data to propagate a value to a cell 132 that contains potential faults/defects. To demonstrate this concept, continuing with the given example, FIG. 4 illustrates an example of a portion of an IC design 400 that is employable to test for boundary model static faults/defects of a cell 404 that implements an AND gate 408 (e.g., the AND gate of the given example). Moreover, continuing with the given example, cell-aware test patterns for the cell 404 are characterized by the DDM 300.

A single cycle test pattern has one or more scan shift cycles to load one or more scan chains with desired values during shifted windows, followed by a single capture pulse to capture an observable effect into scan flops and then shifting out the captured values through the scan chains to scan outputs. The value loaded by the last scan shift into the scan flops provides the conditions needed to excite the static fault to be tested. The design is put in functional mode during the capture window and the capture cycle observes the fault effect at an observable scan flop.

Conversely, a multicycle test pattern has one or more scan shift cycles to load one or more scan chains with desired values during the shift window, followed by two or more capture pulses during the capture window to observe the fault effect at observable scan flops and then shifting out the captured values through the scan chains to scan outputs. In a multicycle test pattern, the values loaded by the last scan shift into the scan flops provide the needed fault initialization values while the first capture clock pulse (launch) creates a transition on the cell input and output. The second capture cycle (capture) observes the fault effect into the scan flop. Static fault detection typically employs a single cycle test pattern, whereas delay fault detection conventionally requires an at-speed multicycle test pattern. The clock pulses in the capture window of an at-speed multicycle pattern are fast clock cycles using a functional clock period. There are some static cell-aware defects which are only detectable with multicycle test patterns. The clock pulses during the capture window in such cases may be slow and use the same clock period as the shift clock cycle period.

The portion of an IC design 400 includes five scan flops (labeled "flop"), namely, scan flop A 412, scan flop B 416, scan flop C 420, scan flop D 424 and scan flop E 428. Each scan flop includes a data input port, (labeled D), a scan-input port (labeled SI), a scan enabled port (labeled SE) and a clock input port (labeled CLK). Additionally, each scan flop includes an output port (labeled Q). For purposes of simplification of explanation, some termination points and interconnections are omitted. For instance, in the present example, it is presumed that the scan flop A 412, the scan flop B 416, the scan flop C 420, the scan flop D 424 and the scan flop E 428 each receive the same scan enable signal, SE and the same clock signal, CLK.

The output port, Q of the scan flop A 412 is provided to an A input port 432 of the AND gate 408 to the scan-input port, SI of the scan flop B 416. Additionally, the output port of the scan flop C 420 is provided to a B input port 436 of the AND gate 408 and to the scan-input port, SI of the scan flop D 424. Accordingly, the scan flop A 412 and the scan flop C 420 are both upstream from the cell 404 that includes the AND gate 408, which is a site with candidate faults/defects. Additionally, an output port Y 440 of the AND gate 408 is coupled to a data input port, D of the scan flop E 428. Accordingly, the scan flop E 428 is downstream from the cell 404.

The scan enable signal, SE provides a multiplexer (MUX) control signal for the scan flop A 412, the scan flop B 416, the scan flop C 420, the scan flop D 424 and the scan flop E 428. In the examples illustrated, it is presumed that the scan enable signal, SE is an active high signal, but in other examples, the scan enable signal can be an active low signal. During time intervals that the scan enable signal, SE is asserted (e.g., logical 1), the scan flop A 412, the scan flop B 416, the scan flop C 420, the scan flop D 424 and the scan flop E 428 are configured to pass a value received at the scan-input port, SI to the output port, Q. Conversely, during time intervals that the scan enable signal, SE is de-asserted (e.g., logical 0), the scan flop A 412, the scan flop B 416, the scan flop C 420, the scan flop D 424 and the scan flop E 428 are configured to pass a value received at the data input port, D to the output port, Q.

The scan flop A 412 and the scan flop B 416 are connected to each other in a first scan chain 450. Additionally, the scan flop C 420 and the scan flop D 424 are connected to each other in a second scan chain 454. The scan flop D 424 is part of another scan chain (or multiple other scan chains) in the IC design 400. The first scan chain 450 is arranged to provide a scan path for a first test data signal, TEST DATA 1 and the second scan chain 454 is arranged to provide a scan path for a second test data signal, TEST DATA 2. The first test data signal, TEST DATA 1 is provided to the scan-input, SI of the scan flop A 412 and the second test data signal, TEST DATA 2 is provided to the scan-input, SI of the scan flop C 420. The first test data signal, TEST DATA 1 can be synchronized with the second test data, TEST DATA 2 to provide values for testing the cell 404 (a fault site) with a particular instance of a test pattern. The IC design 400 is arranged such that if the scan enable signal, SE is asserted (logical 1), the first test data signal, TEST DATA 1 propagates along the first scan chain 450 concurrently with the second test data signal, TEST DATA 2 propagating along the second scan chain 454. Additionally, the IC design 400 is configured such that the value at the scan-in port, SI of the scan flop B 416 is the same value that is applied to the A input port 432 of the AND gate 408 and the value at the scan-in port SI of the scan flop D 424 is the same value that is applied to the B input port 436 of the AND gate 408. Furthermore, the IC design 400 is configured such that the scan flop E 428 captures the Y output port 440 of the AND gate 408. Thus, a value read at the output, Q of the scan flop E 428 is evaluated to determine whether the particular candidate defect (e.g., an open wire) is present within the cell 404 and the value read at the output, Q of the scan flop B 416 and the output, Q of the scan flop D 424 is employable to confirm that the proper value was applied to the A input port 432 and the B input port 436, respectively to test for the presence of the particular candidate fault/defect.

Referring back to FIG. 1, the IC test engine 150 can employ the ATPG techniques to generate test patterns 192. For the examples provided, it is presumed that the test patterns 192 are single cycle boundary model test patterns that are employable to detect static single cycle faults/defects. However, as is explained, results of the application of single cycle test patterns that target single cycle faults/defects are employable for diagnosing multicycle faults/defects.

The IC test engine 150 can output the test patterns 192. The test patterns 192 are employable by an ATE 194 to test the fabricated IC chip 104. In some examples, the test patterns 192 are stored in the memory 116 and/or the ATE 194 prior to execution of the testing. The ATE 194 can alternatively be referred to as an IC chip tester or an IC chip tester machine. The ATE 194 can be implemented as a hardware device that is electrically coupled to pins on the fabricated IC chip 104. In the examples illustrated, such pins can be coupled to the interface 140 of the fabricated IC chip 104.

The test patterns 192 employed by the ATE 194 contain stimuli to be applied to inputs and the expected values on the outputs of the fabricated IC chip 104. The ATE 194 records results of application of the test patterns 192 to the fabricated IC chip 104. The recorded results can be referred to as test result data. More particularly, in the examples where the test patterns 192 represent single cycle test patterns for a first set of static faults/defects (e.g., boundary model candidate defects), the test result data can be referred to as single cycle test result data. The single cycle test result data can identify the test patterns 192 that are applied to the fabricated IC chip 104, as well as the timing of the test patterns 192 and the results of the test patterns.

Moreover, the single cycle test result data can identify expected values and miscompare values that may (or may not) be measured by the ATE 194, which cause failures of particular instance of test patterns in the test patterns 192 to fail. A miscompare refers to an unexpected test result value. For instance, in the IC design 400 of FIG. 4, if a given test pattern is applied that causes the scan flop A 412 to output a logical 1 on the input A 432 of the AND gate 408, and the scan flop C 420 to output a logical 0 on the B input port 436 of the AND gate 408, the output port Y 440 of the AND gate 408 has an expected value of 0. Thus, an output, Q of the scan flop E 428 read as a value of 0 in response to the given test pattern that causes the input A 432 to be a 1 (an expected value) and the B input port 436 to be a 0 would considered to have passed the given test pattern. Conversely, an output, Q of the scan flop E 428 read as a value of 1 in response to the given test pattern would be a miscompare value and would be considered to have failed the given test pattern.

The memory 116 of the computing platform 112 can also execute a diagnostics engine 196. The diagnostics engine 196 can receive the test patterns 192 and the single cycle test result data from the ATE 194. Additionally, in some examples, the diagnostics engine 196 can receive a copy of the fault rules files 158 provided from the fault rules engine 154. The diagnostics engine 196 can employ the test patterns 192 and the single cycle test result data to determine a cause of one or more failures in the fabricated IC chip 104.

Measures within the test patterns 192 that result in miscompares (unexpected values) in single cycle test result data can be categorized as tester failed (TF). Measures within the test patterns 192 that result in expected values in single cycle test results data can be categorized as tester passed (TP). Furthermore, the diagnostics engine 196 can include a fault simulator that fault-simulates a subset of the single cycle test patterns 192 using sim-shifting and determines if application of a subset of the single cycle test patterns in the test patterns 192 mimics application of a multicycle test pattern, such that the single cycle test pattern of such a subset of single cycle test patterns 192 is employable to detect a multicycle candidate fault/defect (or multiple multicycle candidate faults/defects) that are conventionally only detectable with a multicycle test pattern. Stated differently, the diagnostics engine 196 employs the fault simulator 197 to fault-simulate the subset of the single cycle test patterns against candidate faults/defects that are potentially detected by the subset of single cycle test patterns. The candidate faults/defects include multicycle faults/defects. The candidate faults/defects also include single cycle faults/defects (e.g., boundary model stuck-at faults/defects and/or static single cycle cell-aware defects) that were not originally targeted by the test patterns 192. In this manner, the fault simulator 197 of the diagnostics engine 196 utilizes sim-shift techniques to diagnose a set of multicycle static faults/defects in the fabricated IC chip 104 that are conventionally detectable only with multicycle test patterns, and utilize fault simulation to diagnose a set of single cycle static faults/defects that were not targeted by the test patterns 192. Such candidate faults/defects can be single cycle faults/defects or multicycle cell-aware static defects, including the multicycle static cell-aware defects identified in the DDM 300 of FIG. 3. Furthermore, the diagnostics engine 196 can employ the fault simulator 197 to fault-simulate candidate faults/defects to determine the test patterns and measure locations, such as primary output pin(s) and/or observable scan flop(s), where a fault effect is observed. The test patterns and measure locations where the fault effect is measured with fault-simulation of the given fault/defect can be categorized as simulation failed (SF). The test patterns and measure locations where the fault effect is not measured with fault-simulation of the given fault/defect can be categorized as simulation passed (SP).

The diagnostics engine 196 scores the candidate faults/defects applicable to the subset of the single cycle test patterns to determine the most likely fault(s)/defect(s) present in the fabricated IC chip 104. Specifically, the diagnostics engine 196 can combine the single cycle test result data recorded by the ATE 194 with the results of the fault-simulation and categorize each such result into one of four categories, TFSF, TSFP, TPSF and TPSP. TFSF (Tester Failed, Simulation Failed), indicates that a defect was measured by the ATE 194 (tester failed, TF) and that the fault-simulation predicted the fault (simulation failed, SF). TFSP (Tester Failed, Simulation Passed), indicates that a defect was measured by the ATE 194 (tester failed, TF) and that the fault-simulation did not detect the fault (simulation passed, SP). TPSF (Tester Passed, Simulation Failed), indicates that a defect was not measured by the ATE 194 (tester passed, TP) and that the fault-simulation predicted the fault (simulation failed, SF). TPSP (Tester Passed, Simulation Passed), indicates that a defect was not detected by the ATE 194 (tester passed, TP) and that the fault-simulation did not detect the fault (simulation passed, SP). These categories can be employed to score a probability (likelihood) of the presence of each candidate fault/defect, wherein TFSF and TPSP are positive scores (increasing the probability for a corresponding candidate fault/defect) and TFSP and TPSF are negative scores (decreasing the probability for the corresponding candidate fault/defect). Stated differently, the categories of TFSF and TPSP show consistency between the measured results of application of the test patterns 192 to the fabricated IC chip 104 and simulation of applicable test patterns 192 for particular candidate faults/defects, thereby increasing the probability that a corresponding candidate fault/defect is actually present in the fabricated IC chip 104. Conversely, the categories of TFSP and TPSF show an inconsistency between the measured results of application of the test patterns 192 to the fabricated IC chip 104 and the simulation of applicable test patterns 192 for particular candidate faults/defects, thereby decreasing the likelihood that a corresponding candidate fault/defect is present in the fabricated IC chip 104.

Figure 5:
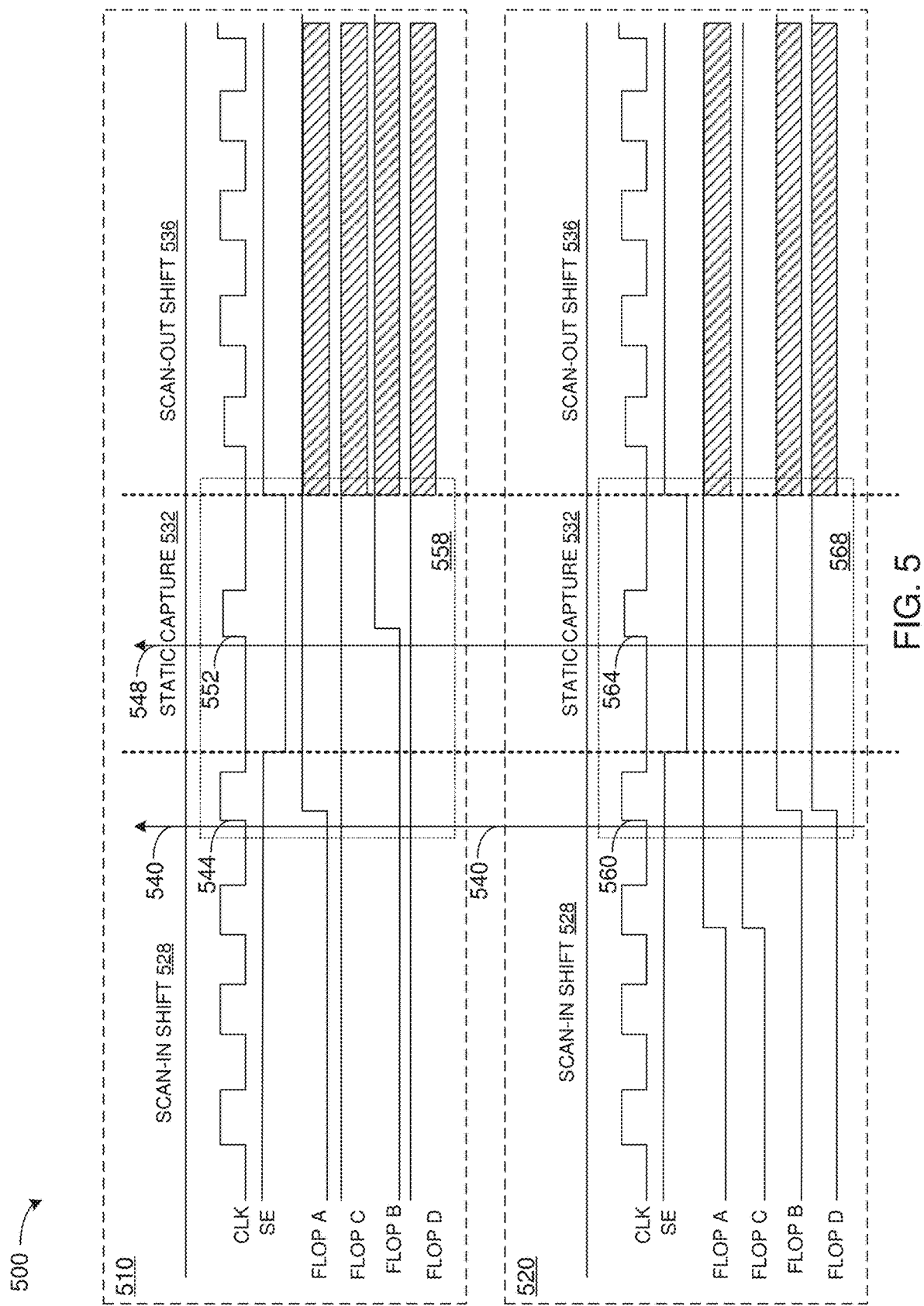
FIG. 5 illustrates a waveform diagram with a first set of waveforms and a second set of waveforms that represent waveforms of signals propagating through the scan chain of FIG. 4.

As a demonstration of these concepts, FIG. 5 illustrates a waveform diagram 500 with a first set of waveforms 510 and a second set of waveforms 520 that represent waveforms of signals propagating through the IC design 400 of FIG. 4. For purposes of illustration, the first set of waveforms 510 and the second set of waveforms 520 are plotted on the same time scale, and the same reference numbers are employed in FIGS. 4 and 5 to denote the same structure.

The first set of waveforms 510 corresponding to a first test pattern and the second set of waveforms 520 corresponding to a second test pattern both represent application of a single cycle boundary model test pattern of A=1, B=1 with an expected value of Y=1 that target a particular static fault/defect at the AND gate 408 of FIG. 4. However, as illustrated, the timing of the application of the first test pattern corresponding to the first set of waveforms 510 and the timing of the second test pattern corresponding to the second set of waveforms 520 is different, which differences are utilized to improve diagnostics of faults. In the examples provided, the particular static fault/defect is a stuck-at 0 fault/defect for the Y output port 440. In a situation where the particular fault/defect (stuck-at 0 for the Y output port 440) was present in a fabricated IC chip (e.g., the fabricated IC chip 104), the value at the Y output port 440 would be 0 no matter the value at the A input port 432 and/or the B input port 436. Additionally, it is presumed that for the first set of waveforms 510, single cycle test result data (e.g., provided by the ATE 194 of FIG. 1) indicates that an miscompare value of 0 was recorded, such that the first test pattern corresponding to the first set of waveforms 510 is recorded as failed (TF) by the ATE. Conversely, for the second set of waveforms 520, it is presumed that for the second set of waveforms 520, the single cycle test result data indicates that an expected value of 1 was recorded, such that the second test pattern corresponding to the second set of waveforms 520 is recorded as passed (TP) by the ATE.

The first set of waveforms 510 and the second set of waveforms 520 includes a scan-in shift interval 528 (shift window), a static capture interval 532 and a scan-out shift interval 536. In the first set of waveforms 510 and the second set of waveforms 520, the scan enable signal, SE is asserted (logical 1) during the scan-in shift interval 528 (shift window) and the scan-out shift interval 536 and de-asserted (logical 0) during the static capture interval 532.

For the first set of waveforms 510 and the second set of waveforms 520, during the scan-in shift interval 528 (shift window), a fault initialization 540 occurs in response to a last shift pulse of the clock signal, CLK, which in turn is prior to the static capture interval 532. For purpose of comparison, the first set of waveforms 510 and the second set of waveforms 520 are illustrated as having the same fault initialization 540. For the first set of waveforms 510, at a pulse 544 (launch) of the clock signal, CLK (a last shift pulse before the static capture interval 532), the scan flop A 412 provides an output, Q of 0, the scan flop B 416 provides an output Q of 0. Additionally, at the pulse 544, the scan flop C 420 provides an output Q of 1 and the scan flop D also provides an output Q of 1. In response to the pulse 544, the output Q of the scan flop A 412 transitions from a 0 to a 1, and the scan flop C 420 remains at 1.

The first set of waveforms 510 elicits the shift pulse 544 of the clock signal, CLK during the scan-in shift interval 528 (shift window) which results in fault excitation 548 and the capture pulse 552 of the clock signal, CLK for the first set of waveforms 510 during the capture interval 532 which observes the effect (if any) of the candidate fault/defect (e.g., a multicycle static cell-aware defect) in the scan flop B 416 and the scan flop D 424. In response to the clock pulse 552 (capture), the output Q of the scan flop B 416 transitions from 0 to 1. Moreover, the output of scan flop D 424 remains at 1. Thus, at the time of the pulse 552, the AND gate 408 has a value of 1 applied to the input A 432 and to the B input port 436.

The diagnostics engine (e.g., the diagnostics engine 196 of FIG. 1) can employ a fault simulator to fault-simulate the test pattern implemented by the first set of waveforms 510 against other candidate faults/defects to determine if the test pattern is employable to detect other candidate faults/defects. More particularly, the fault simulator of the diagnostics engine can fault-simulate the test pattern implemented by the first set of waveforms 510 against the other candidate faults/defects and utilize sim-shifting to determine if the single cycle test pattern applied by the first set of waveforms 510 to test for the particular candidate fault/defect (e.g., a stuck-at 0 of the output Y of the AND gate 408) is also applicable as a multicycle test pattern for another candidate fault/defect, such as a cell-aware candidate defect. To make this determination, the fault simulator 197 of the diagnostics engine 196 of FIG. 1 employs sim-shifting to fault-simulate the cell-aware candidate fault/defect by evaluating a time window 558 (capture window) of the first set of waveforms 510 and compares a test pattern formed by the waveforms within the time window 558 (capture window) with multicycle test patterns for static faults/defects, such as the test patterns characterized in the DDM 300 of FIG. 3. The time window 558 (capture window) includes an Nth cycle (capture) for the test pattern. The shift window 528 includes the last shift pulse 544 used as cycle N−1 for sim-shifting. As illustrated by the first set of waveforms 510, prior to the pulse 544 during the scan-in shift interval 528 (shift window), the AND gate 408 has an input of A=0 and B=1. Moreover, responsive to the pulse 544, the values applied to the AND gate 408 transition to A=1 and B=1. Thus, collectively, this is a two-cycle (multicycle) test pattern of A=01 and B=11, which corresponds to the test pattern p1 (01:11 01) of the DDM 300. Accordingly, the static cell-aware defects detectable by the pattern p1 of the DDM 300 of FIG. 3 may be detectable with the first set of waveforms 510, in addition to detecting for the particular static fault/defect for which the first set of waveforms 510 targeted (e.g., the stuck-at 0 at the Y output port 440). Additionally, the fault simulation of the test pattern characterized by the first set of waveforms 510 may (or may not) enable detection of single cycle static fault(s)/defect(s) for which the test pattern was not originally generated to detect.

The sim-shifting of the single cycle test pattern characterized by the first set of waveforms 510 allows the diagnostics engine to employ the fault simulator to fault-simulate a selected number (N−1) of shift cycles at a tail end of the scan-in shift interval 528 (shift window) of the single cycle test pattern of the subset of single cycle test patterns to identify a transition upstream from a corresponding candidate fault/defect (e.g., within the cell 404). Additionally, the fault-simulation of the N−1 shift cycles at the tail end of the scan-in shift interval 528 (shift window) utilizing sim-shifting enables the fault simulator of the diagnostics engine to employ the transition during the scan-in shift interval 528 (shift window) of the single cycle test pattern as a fault initialization cycle (e.g., a launch or release cycle) of a corresponding multicycle test pattern for the corresponding candidate fault/defect, such as the pattern p1 of the DDM 300 of FIG. 3. Moreover, the sim-shifting enables the pulse 552 (capture) of the clock signal, CLK during the static capture interval 532 of the first test pattern to capture a value downstream from the corresponding candidate fault/defect.

For the second set of waveforms 520, at a pulse 560 of the clock signal, CLK (launch), the scan flop A 412, provides an output, Q of 1, the scan flop B 416 provides an output Q of 0. Additionally, at the pulse 560, the scan flop C 420 provides an output Q of 1 and the scan flop D also provides an output Q of 1. In response to the pulse 560, the output Q of the scan flop B 416 transitions from a 0 to a 1, and the scan flop C 420 remains at 1.

The second set of waveforms 520 elicits the shift pulse 560 of the clock signal, CLK during the scan-in shift interval 528 (shift window) which results in the fault excitation 548 and the capture pulse 564 of the clock signal, CLK for the second set of waveforms 520 during the capture interval 532 which observes the effect (if any) of the candidate fault/defect (e.g., a multicycle static cell-aware defect) in the scan flop B 416 and the scan flop D 424. In response to the clock pulse 564 (capture), the output Q of the scan flop B 416 and the output of scan flop D 424 remains at 1. Thus, at the time of the pulse 564, the AND gate 408 has a value of 1 applied to the input A 432 and to the B input port 436, similar to the first set of waveforms 510.

The diagnostics engine (e.g., the diagnostics engine 196 of FIG. 1) can also employ the fault simulator utilizing sim-shifting to fault-simulate the second set of waveforms 520 against other candidate faults/defects to determine if the single cycle test pattern applied by the second set of waveforms 520 to test for the particular candidate fault/defect (e.g., a stuck-at 0 of the output Y of the AND gate 408) is applicable as a multicycle test pattern for another candidate fault/defect, such as a cell-aware candidate defect. To make this determination, the diagnostics engine employs the fault simulator and utilizes sim-shifting to fault-simulate the last shift cycle of the shift window 528 and the capture pulse of the capture window 568 of the second set of waveforms 520 and compares the resultant initialization and capture values with the activation and capture requirements for multicycle static faults/defects, such as the test patterns characterized in the DDM 300 of FIG. 3. The last shift pulse 560 of the shift window 528 is utilized as N−1 cycle (launch) and the capture pulse 564 of the capture window 568 is utilized as the Nth cycle (capture) of the multicycle test pattern. As illustrated by the second set of waveforms 520, prior to the pulse 560 during the scan-in shift interval 528 (shift window), the AND gate 408 has an input of A=1 and B=1. Moreover, responsive to the pulse 560, the values applied to the AND gate 408 remain at A=1 and B=1. Thus, collectively, this is a two-cycle (multicycle) test pattern of A=11 and B=11, which does not correspond to any of the test pattern p1-p4 (01:11 01) of the DDM 300. Accordingly, in the example provided, it is presumed that the test pattern applied by the second set of waveforms 520 with fault-simulating using sim-shifting techniques are not employable to test for the cell-aware defects characterized in the DDM 300, but are employable for detecting for the particular static fault/defect for which the second set of waveforms 520 was generated (e.g., the stuck-at 0 at the Y output port 440). Additionally, the fault simulation of the test pattern characterized by the second set of waveforms 520 may (or may not) enable detection of single cycle static fault(s)/defect(s) for which the test pattern was not originally generated to detect.

Continuing with this example, as noted, it is presumed that the ATE (e.g., the ATE 194 of FIG. 1) measured a failure (miscompare) for the first test pattern applied by the first set of waveforms 510 and measured a pass (expected value) for the second test pattern applied by the second set of waveforms. Accordingly, the diagnostics engine (e.g., the diagnostics engine 196 of FIG. 1) can categorize the measure on flop E 428 during the first test pattern as a tester failed (TF) and categorize the measure on flop E 428 during the second test pattern as tester passed (TP).

Furthermore, the diagnostics engine can fault-simulate candidate faults/defects to determine the testability of each such candidate fault/defect by the first test pattern and the second test pattern. In the present example, a first defect, F1 is presumed to be a stuck open internal to the cell 404, such that the first defect, F1 is only detectable by a cell-aware test pattern of A=01, B=11 resulting in Y=I/O, wherein 1 is the expected value and 0 is the miscompare value. For simplification of explanation, it is presumed that the first defect, F1 corresponds to the defect characterized by column 1, row 1 of the matrix 308 of the DDM 300 of FIG. 3. Additionally, a second defect, F2 is presumed to be the stuck-at 0 for the output Y of the AND gate 408 that is detectable with A=1, B=1 resulting in Y=I/O, wherein 1 is the expected value and 0 is the miscompare value.

Fault-simulating the second defect F2 can reveal that the stuck-at 0 would be detectable by the first test pattern or the second test pattern, whether or not sim-shifting is applied. Thus, in relation to the second defect, F2, the fault-simulation marks the measure on flop E 428 during both the first and second test patterns as simulation failed (SF). In contrast, fault-simulating the first defect F1 reveals that the stuck open defect is not detectable without sim-shifting, since the stuck open requires a multicycle test pattern. Accordingly, with consideration of sim-shifting single cycle test patterns to mimic multicycle test patterns, the last shift cycle of the shift window 528 and the capture cycle of the capture window 532 are respectively fault-simulated as launch and capture cycles of a multicycle pattern. The first test pattern causes the condition of A=01, B=11, such that the first test pattern can excite the first defect F1. Accordingly, in relation to the first defect F1, the diagnostics engine can categorize the measure on flop E 428 as simulation failed (SF) for the first test pattern. Sim-shifting of the second test pattern causes the condition of A=11, B=11, such that the conditions for detecting the first defect F1 (A=01) is not met. Because the conditions for detecting the first defect F1 are not met by the second pattern, the measure on flop E 428 during the second pattern is scored as simulation passed (SP) for the second defect F2.

The diagnostics engine can combine the results recorded by the ATE, tester failed (TF) or tester passed (TP) with the results of the fault-simulation, simulation failed (SF) or simulation passed (SP) and categorize each such result into one of four categories, TFSF, TSFP, TPSF and TPSP. Table 1 illustrates a summary of the findings of the diagnostics engine in relation to the application of the first test pattern and the second test pattern for the first defect, F1 and the second defect F2. As noted, the category of TFSF or TPSP are positive scores and the categories of TSFP or TSSF are negative scores. Accordingly, the diagnostics engine aggregates a simulated testability and the single cycle test results for two or more test patterns of the subset of the single cycle test patterns. More generally, the diagnostics engine aggregates fault simulation results and single cycle test result data for two or more measures from a given test pattern.

TABLE 1

| N-1 SIMSHIFT | FIRST TEST PATTERN | SECOND TEST PATTERN | SCORE |
| --- | --- | --- | --- |
| F1 | TFSF (+) | TPSP (+) | 100% EXPLAINS |
| F2 | TFSF (+) | TPSF (−) | 50% EXPLAINS |

As illustrated in Table 1, utilizing sim-shifting during diagnostics fault simulation of the first defect F1 against the first test pattern implemented with the first set of waveforms 510 and the second test pattern implemented by the second set of waveforms 520 gives results (TFSF and TPSP) consistent with the measurements on the ATE (e.g., the ATE 194 of FIG. 1) of the first test pattern and the second test pattern. Conversely, the diagnostics engine that includes fault-simulation utilizing sim-shifting also reveals that the fault-simulation of the second defect, F2 is inconsistent with the results (TPSF) of the second test pattern measured by the ATE (e.g., the ATE 194 of FIG. 1). Accordingly, in the given example, the diagnostics engine determines and reports that there is a greater probability that the first fault/defect, F1, is present in the fabricated IC chip (e.g., the fabricated IC chip 104 of FIG. 1) than the second defect, F2.

Referring back to FIG. 1, by categorizing a combination of fault simulation and test results from the single cycle test result data, the diagnostics engine 196 can determine a candidate fault/defect that is the most likely cause of a fault/defect measured by the ATE 194. More particularly, the diagnostics engine 196 can compare the single cycle test results data for a first set of static faults/defects (for which the single cycle test patterns are originally targeted) and other single cycle faults/defects detectable by these single cycle test patterns (e.g. single cycle static cell-aware defects). The diagnostics engine 196 can also examine results of sim-shifting the single cycle test patterns, and applying these sim-shifted single cycle test patterns to a second set of candidate faults/defects (e.g., multicycle cell-aware defects) that are only detectable with multicycle test patterns to detect the second set of candidate faults/defects to determine a first probability that the observed miscompare values of the single cycle test results is caused by a static fault of the first set of static faults/defects and a second probability that the miscompare values of the single cycle test results is caused by a static fault of the second set of static faults/defects. Accordingly, the diagnostic engine 196 can compare the single cycle test result data and fault simulation results for the faults and/or defects in a combination of the first set and the second set of static faults and/or defects to determine an order of probability that miscompare values for the single cycle test results are caused by a particular static fault and/or defect and other static faults and/or defects. The diagnostics engine 196 can generate a diagnostics report that includes data characterizing a most likely fault/defect as a cause for every test pattern measure (or some subset thereof) wherein a miscompare was reported in the single cycle test result data. The diagnostic report can be employed, for example to determine the most likely fault/defect in the fabricated IC chips 104 failing on the ATE 194 within required operating specifications (e.g., within acceptable tolerances). This information can be used to improve the manufacturing process to alleviate the source of failing fabricated IC chips 104 and improve yield metrics such as DPPM (defective parts per million).

Furthermore, in some situations, the diagnostic report generated by the diagnostics engine 196 is employable to determine whether a manufacturing process or the IC design 108 is causing a fault/defect or if the fault/defect is an anomaly. For example, if the diagnostic report of multiple instances of the fabricated IC chip 104 reveals the same fault/defect, a reviewer of the diagnostic reports might determine that changes are needed to the IC design 108 and/or a manufacturing process to avoid the fault/defect for future instances of the fabricated IC chip 104. Conversely, in examples where the diagnostic reports of multiple instances of the fabricated IC chip 104 indicates that the faults/defects are occurring randomly, a reviewer of the diagnostic reports might determine that faults/defects are caused by uncontrollable environmental problems (e.g., temperature, dust, etc.) and that no changes are needed to the IC design 108 or the manufacturing process for the fabricated IC chip 104.

By employing the diagnostics engine 196, in examples where the test patterns 192 generated by the IC test engine 150 include single cycle test patterns testing for static faults/defects, the results of application of the test patterns 192 can be parsed, and employed to test for static faults/defects that require multicycle test patterns and/or single cycle faults/defect that were not originally targeted by the test patterns 192. In particular, as demonstrated, the diagnostics engine 196 can sim-shift such single cycle test patterns to leverage previously ignored information present in the single cycle test result data generated by the ATE 194. Such sim-shifting can improve the accuracy in predicting a cause of faults in the fabricated IC chip 104 without requiring additional tests to be executed separately.

Figure 6:
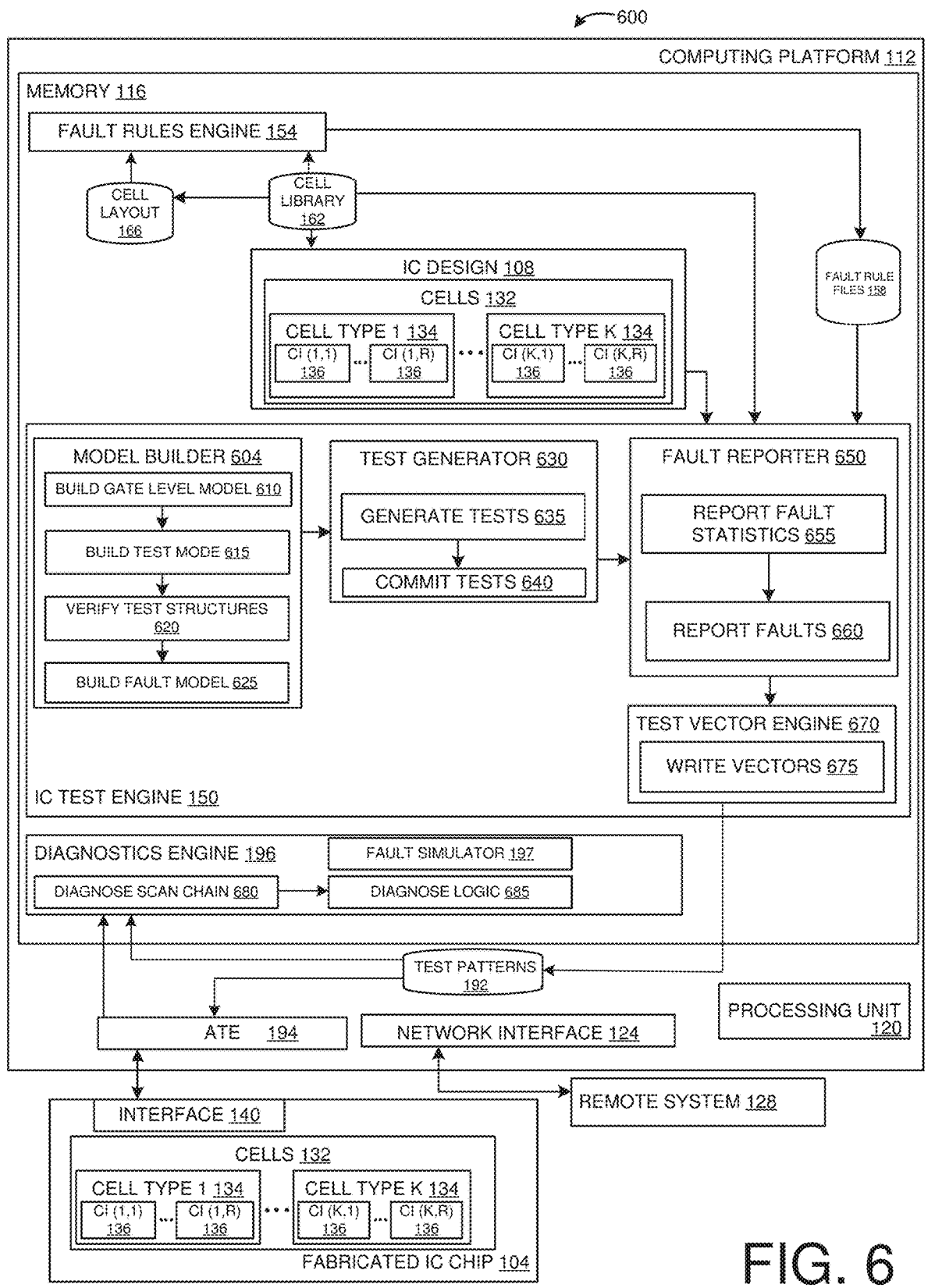
FIG. 6 illustrates another example of a system for diagnosing faults and/or defects in a fabricated IC chip that is based on an IC design.

FIG. 6 illustrates a system 600 for diagnosing measured faults in the fabricated IC chip 104. The system 600 is similar to the system 100 of FIG. 1 with a detailed view and description of the IC test engine 150 and the diagnostics engine 196. Thus, for purposes of simplification of explanation, the same reference numbers are employed in FIGS. 1 and 6 to denote the same structure. Additionally, some reference numbers are not re-introduced. The IC design 108 can be stored in the memory 116 of the computing platform 112. The IC design 108 can be implemented, for example, as design specifications for an IC chip. The fabricated IC chip 104 represents a physical instantiation of the IC design 108, and the interface 140 can provide an interface for external systems to provide stimuli to the components of the fabricated IC chip, including the cells 132 of the fabricated IC chip 104.

The IC test engine 150 stored in the memory 116 is configured to employ ATPG techniques to generate the test patterns 192 that include single cycle test patterns that are configured to test for static faults/defects in the fabricated IC chip 104 to ensure proper operation. More particularly, the IC test engine 150 generates the test patterns 192 that are employable by the ATE 194 to test the fabricated IC chip 104. The ATE 194 is configured to apply the test patterns 192 to the fabricated IC chip 104 and record the results in single cycle test result data. The single cycle test result data and the test patterns 192 can be sent to the diagnostics engine 196 to diagnose the cause of one or more failures of test patterns recorded in the single cycle test result data in the fabricated IC chip 104.

The IC test engine 150 can also operate in concert with the fault rules engine 154 stored in the memory 116. The fault rules engine 154 can be configured/programmed to generate fault rules files 158. In some examples, the fault rules engine 154 generates DDMs that each represent a user-readable format of a corresponding fault rules file 158. Each fault rules file 158 represents a set of fault rules for a particular cell type 134 that corresponds to a cell that is selected from a cell library 162. The cell library 162 can include, but is not limited to, data characterizing a physical layout of each of the K number of cell types 134 in the cells 132 of the IC design 108 and the fabricated IC chip 104. The cell library 162 can also include structural Verilog (.v), behavioral Verilog (.v) and timing models (.lib).

To generate the fault rules files 158, the fault rules engine 154 can read a cell layout 166 from the cell library 162. The cell layout 166 can characterize a physical layout for a particular cell type 134 extracted from the cell library 162. The fault rules engine 154 generates a particular fault rules file 158 of the fault rules files 158 based on the cell identified in the cell layout 166. Each fault rules file 158 can provide information similar to the information included in the DDM 300 described with respect to the given example. The fault rules files 158 for each of the K number of cell types 134 of the cells 132 included in the IC design 108 are provided to the IC test engine 150 for the generation of the test patterns 192 for the fabricated IC chip 104 using ATPG techniques.

The IC test engine 150 can represent a plurality of software modules operating in an ordered sequence to generate the test patterns 192 using ATPG techniques. The IC test engine 150 includes a model builder 604 that can build a model of the IC design 108 that is employable to generate test patterns to test the fabricated IC chip 104. To build the model of the IC design 108, the model builder 604 can execute model builder operations. More particularly, at 610, the model builder 604 builds a gate level model of the IC design 108. At 615, the model builder 604 builds a test mode. The build test mode reads test pin specifications and creates a test mode view given these test pin specifications. Such test pin specifications, among other things, can include scan-input pin names, scan-output pin names, test clock pin names, set/reset pin names and other constraints necessary to put the design in a test mode.

At 620, the model builder 604 verifies the presence of test structures in the gate level model of the IC design 108. The test structures represent scan and test circuitry present in the IC design 108 to facilitate the application of cell-aware test patterns to the fabricated IC chip 104. The operations at 620 also check if the IC design 108 complies with test design rules given the test constraints/specifications read in 615. For example, the operations at 620 can verify that the flops in the IC design 108 can be controlled by specified test clocks, and can verify that these test clocks can be controlled properly through primary input pins. Additionally, the operations at 620 can verify that set/reset to flops can be controlled through primary input pins and/or that the flops are in an off state.

At 625, the model builder 604 can employ the gate level design and the fault rules files 158 to build a fault model for the IC design 108. The fault model includes candidate faults/defects represented as stuck-at 1 or 0 and/or other faults/defects such as cell-aware defects. The fault model built by the model builder 604 can be provided to a test generator 630 of the IC test engine 150.

The test generator 630 can execute test generation operations for static test patterns, including single cycle test patterns. More particularly, at 635, the test generator 630 can employ ATPG techniques to generate single cycle test patterns, such as boundary model test patterns and cell-aware test patterns for the fabricated IC chip 104 based on the fault model generated by the model builder 604. More specifically, the IC test engine 150 can generate a set of test patterns tailored for each of the R number of cell instances 136 of each of the K number of cell types 134 of the cells 132 in the IC design 108. The test patterns are generated based on candidate faults/defects of cells 132 of the IC design 108. At 640 the test generator 630 commits the test patterns generated at 635 to test the fabricated IC chip 104. The test patterns generated by the test generator 630 can be provided to a fault reporter 650.

The fault reporter 650 can execute operations related to fault reporting. More particularly, at 655, the fault reporter 650 can generate report fault statistics that characterize, for example data related to the test patterns applied to the fabricated IC chip 104. Additionally, at 660, the fault reporter 650 can generate fault reports for the fault statistics and cell defect statistics.

A test vector engine 670 of the IC test engine 150 can convert the ATPG test patterns into a format consumable by the ATE 194. In particular, at 675, the test vector engine 670 can write vectors that implement the test patterns 192 that are employable by the ATE 194. The test patterns 192 can be stored, for example, on the memory 116 and/or at the ATE 194.

The ATE 194 stimulates inputs of the fabricated IC chip 104 as dictated by the test patterns 192 and the ATE 194 is configured to compare a measured output of the fabricated IC chip 104 with expected values stored in the test patterns 192. The results of the tests are stored as single cycle test result data. At a subsequent time, this single cycle test result data can be provided to the diagnostics engine 196.

The diagnostics engine 196 can receive the test patterns 192 and the single cycle test result data from the ATE 194. Additionally, in some examples, the diagnostics engine 196 can receive a copy of the fault rules files 158 provided from the fault rules engine 154. The diagnostics engine 196 can employ the test patterns 192 and the single cycle test result data to determine a cause of one or more failures in the fabricated IC chip 104. The test result data can include miscompare values for particular test patterns 192, wherein a value measured by the ATE 194 differed from an expected value.

The diagnostics engine 196 can categorize the measures during test patterns 192 that result in these miscompare values (unexpected values) as tester failed (TF), and measures during test patterns 192 that result in expected values measured by the ATE 194 as tester passed (TP). Furthermore, at 680, the diagnostics engine 196 can employ a fault-simulator 197 to diagnose the measured values in a scan chain in the IC design 108 (e.g., the first scan chain 450 and the second scan chain 454 of the IC design 400 of FIG. 4).

At 685, the diagnostics engine 196 can employ the fault simulator to diagnose logic in the IC design 108 and fault-simulate candidate faults/defects to determine a list of faults/defects that would cause the IC design 108 to fail in presence of the given fault/defect on the ATE 194, while applying a given single cycle test pattern. The measures during diagnostics fault simulation of candidate faults/defects that observe the fault effect are categorized as simulation failed (SF) for a given test pattern and fault/defect. The measures during diagnostics fault simulation that do not observe the fault effect are categorized as simulation passed (SP) for the given test pattern and fault/defect. Additionally, at 685, the diagnostics engine 196 can combine the single cycle test result data recorded by the ATE 194 with the results of the fault-simulation and categorize each such result into one of four categories, TFSF, TSFP, TPSF and TPSP. These categories are employable to score each execution of the test patterns 192 for different possible candidate faults/defects. The categories of TFSF and TPSP are positive scores (increasing the probability for the corresponding candidate fault/defect) and TFSP and TPSF are negative scores (decreasing the probability for the corresponding candidate fault/defect). Stated differently, the categories of TFSF and TPSP show consistency between measured results of application of the test patterns 192 to the fabricated IC chip 104 and the simulation of the application of the test patterns 192, thereby increasing the probability that a corresponding candidate fault/defect is actually present in the fabricated IC chip 104. Conversely, the categories of TFSP and TPSF show an inconsistency between the measured results of application of the test patterns 192 to the fabricated IC chip 104 and the simulation of the application of the test patterns 192, thereby decreasing the probability that a corresponding candidate fault/defect is present in the fabricated IC chip 104. Accordingly, for each test pattern 192 that has been categorized as tester failed (TF), the diagnostics engine can determine a most likely cause, namely a most likely (greatest probability) fault/defect present in the fabricated IC chip 104.

The diagnostics engine 196 can generate a diagnostics report summarizing the most likely faults/defects (if any) that are present in the fabricated IC chip 104. Furthermore, in some situations the diagnostic report generated by the diagnostics engine is employable to determine whether a manufacturing process or the IC design 108 is causing a fault/defect or if the fault/defect is an anomaly.

By employing the diagnostics engine 196, in examples where the test patterns 192 generated by the IC test engine 150 include single cycle test patterns testing for static faults/defects, the results of application of the test patterns 192 can be parsed, and employed to test for static faults/defects that require multicycle test patterns, as well as testing for static faults/defects that were not originally targeted by the test patterns 192. In particular, as demonstrated, the diagnostics engine 196 can fault-simulate and sim-shift such single cycle test patterns to leverage previously ignored information present in the single cycle test result data generated by the ATE 194. Such sim-shifting can improve the accuracy in predicting a cause of faults in the fabricated IC chip 104 without requiring additional test patterns to be executed separately.

Figure 7:
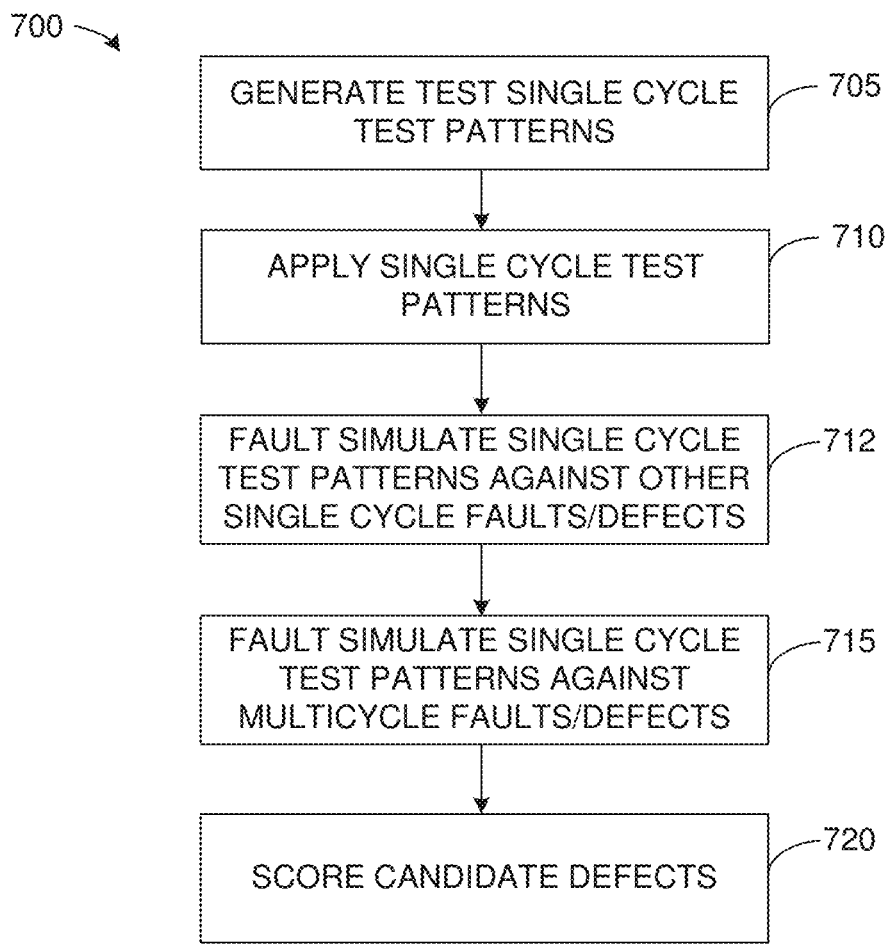
FIG. 7 illustrates a flowchart of an example method for diagnosing faults and/or defects in a fabricated IC chip.

In view of the foregoing structural and functional features described above, example methods will be better appreciated with reference to FIG. 7. While, for purposes of simplicity of explanation, the example method of FIG. 7 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 7 illustrates a flowchart of an example method 700 for diagnosing faults/defects in a fabricated IC chip. The method 700 can be implemented by the system 100 of FIG. 1 and/or the system 600 of FIG. 6. At 705, an IC test engine (e.g. the IC test engine 150 of FIG. 1) generates single cycle test patterns for testing for candidate faults/defects of a first set of static faults/defects of an IC design. The first set of static faults/defects can be boundary model faults/defects that are detectable with a single cycle test pattern. At 710, an ATE (e.g., the ATE 194 of FIG. 1) applies the plurality of single cycle test patterns to a fabricated IC chip that is based on the IC design and provides single cycle test result data characterizing application of the single cycle test patterns to the fabricated IC chip.

At 712, a diagnostics engine (e.g., the diagnostics engine 196 of FIG. 1) selectively fault-simulates a second subset of single cycle test patterns against other single cycle faults/defects to diagnose a second set of static faults/defects in the fabricated IC chip. The second set of static faults/defects can be, for example, boundary model stuck-at faults/defects and/or single cycle static cell-aware defects.

At 715, a diagnostics engine (e.g., the diagnostics engine 196 of FIG. 1) selectively fault-simulates a second subset of single cycle test patterns against multicycle faults/defects utilizing sim-shifting to diagnose a third set of static faults/defects in the fabricated IC chip. The third set of static faults/defects can be, for example, multicycle static cell-aware faults/defects that are conventionally only detectable with a multicycle test pattern. The fault-simulation and sim-shifting enables the single cycle test patterns to mimic the operations of the multicycle test patterns. At 720, the diagnostics engine can score candidate faults/defects (e.g. TPSP, TFSP, TPSF or TFSM) in the first set of static faults/defects, the second set of static faults/defects and the third set of static faults/defects for each applicable test pattern of the subset of the single cycle test patterns to determine a most likely fault/defect present in the fabricated IC chip. Stated differently, at 720, the diagnostics engine scores the candidate faults/defects, which includes multicycle static defects applicable to the subset of the single cycle test patterns to determine the most likely fault/defect(s) present in the fabricated IC chip. Thus, the method 700 enables the diagnosis of faults/defects, such as static multicycle cell-aware defects, that are conventionally only detectable with a multicycle test pattern without the need to separately execute such multicycle test patterns.

Figure 8:
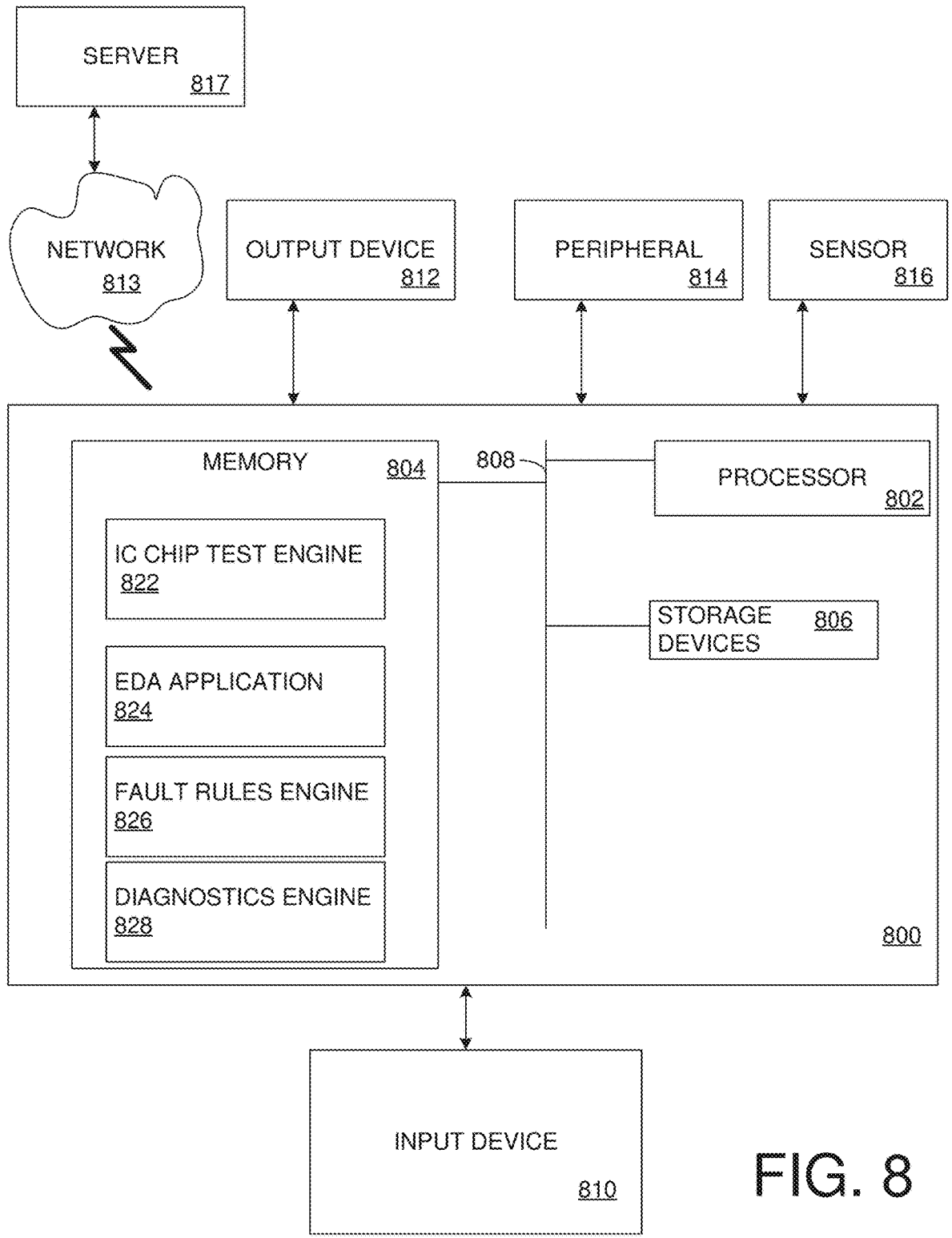
FIG. 8 illustrates an example of a computing system employable to execute an IC test engine and a fault rules engine.

The examples herein may be implemented on virtually any type of computing system regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory and input and output device(s) to perform one or more embodiments. As shown in FIG. 8, the computing system 800 can include a computer processor 802, associated memory 804 (e.g., RAM), cache memory, flash memory, etc.), one or more storage devices 806 (e.g., a solid state drive, a hard disk drive, an optical drive such as a compact disk (CD) drive or digital versatile disk (DVD) drive, a flash memory stick, etc.) and numerous other elements and functionalities. The computer processor 802 may be an IC chip for processing instructions. For example, the computer processor may be one or more cores, or micro-cores of a processor. Components of the computing system 800 can communicate over a data bus 808.

The computing system 800 may also include an input device 810, such as any combination of one or more of a touchscreen, keyboard, mouse, microphone, touchpad, electronic pen, or any other input device. Further, the computing system 800 can include an output device 812, such as one or more of a screen (e.g., light emitting diode (LED) display, an organic light emitting diode (OLED) display, a liquid crystal display (LCD), a plasma display, touchscreen, cathode ray tube (CRT) monitor, projector, or other display device), a printer, external storage, or any other output device. In some examples, such as a touch screen, the output device 812 can be the same physical device as the input device 810. In other examples, the output device 812 and the input device 810 can be implemented as separate physical devices. The computing system 800 can be connected to a network 813 (e.g., LAN, a wide area network (WAN) such as the Internet, a mobile network, or any other type of network) via a network interface connection (not shown). The input device 810 and output device(s) 812 can be connected locally and/or remotely (e.g., via the network 813) to the computer processor 802, the memory 804 and/or the storage devices 806. Many different types of computing systems exist, and the aforementioned input device 810 and the output device 812 can take other forms. The computing system 800 can further include a peripheral 814 and a sensor 816 for interacting with the environment of the computing system 800 in a manner described herein.

Software instructions in the form of computer readable program code to perform embodiments disclosed herein can be stored, in whole or in part, temporarily or permanently, on a non-transitory computer readable medium such as a CD, DVD, storage device, a diskette, a tape, flash memory, physical memory, or any other computer readable storage medium. Specifically, the software instructions can correspond to computer readable program code that when executed by a processor, is configured to perform operations disclosed herein. The computing system 800 can communicate with a server 817 via the network 813.

The memory 804 can include an IC test engine 822 to test an IC design that is instantiated as a fabricated IC chip. The IC design can be generated, for example, by an EDA application 824. The memory 804 can also include a fault rules engine 826 for generating fault rules files and/or DDMs to facilitate the testing of the fabricated IC chip. The memory further includes a diagnostics engine 828 for analyzing test result data and test patterns generated by the IC test engine 822 to diagnose a cause of failures in the fabricated IC chip.

Further, one or more elements of the aforementioned computing system 800 can be located at a remote location and connected to the other elements over the network 813. Additionally, some examples can be implemented on a distributed system having a plurality of nodes, where each portion of an embodiment can be located on a different node within the distributed system. In one example, the node corresponds to a distinct computing device. Alternatively, the node can correspond to a computer processor with associated physical memory. The node can alternatively correspond to a computer processor or micro-core of a computer processor with shared memory and/or resources.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means based at least in part on". Additionally, where the disclosure or claims recite "a," "an," "a first," or "another" element, or the equivalent thereof, it should be interpreted to include one or more than one such element, neither requiring nor excluding two or more such elements.

What is claimed is:

1. A non-transitory machine-readable medium having machine-readable instructions, the machine-readable instructions comprising:
    an integrated circuit (IC) test engine that generates single cycle test patterns for testing for candidate faults and/or defects of a first set of static faults and/or defects of an IC design; and
    a diagnostics engine that:
        receives single cycle test result data characterizing application of the single cycle test patterns to a fabricated IC chip based on the IC design by automatic test equipment (ATE), in which the test result data includes a set of miscompare values characterizing a difference between an expected result and a result measured by the ATE for a given single cycle test pattern of the single cycle test patterns;
        employs a fault simulator to:
            fault-simulate a first subset of the single cycle test patterns against a single cycle fault model to diagnose a second set of static faults and/or defects; and
            fault-simulate a second subset of the single cycle test patterns against a fault model that includes multicycle static faults and/or defects utilizing sim-shifting to diagnose a third set of static faults and/or defects in the fabricated IC chip that are only detectable with multicycle test patterns; and
        scores candidate fault and/or defects in the first set of static faults and/or defects, the second set of static faults and/or defects and the third set of static faults and/or defects for applicable test patterns of the first and second subsets of the single cycle test patterns to determine a most likely fault and/or defect present in the fabricated IC chip.

2. The medium of claim 1, wherein the sim-shifting of the second subset of the single cycle test patterns comprises:
    fault-simulating a scan-in shift interval of a respective single cycle test pattern of the second subset of the single cycle test patterns to identify a transition upstream from a corresponding candidate fault and/or defect of the third set of static faults and/or defects in the fabricated IC chip;
    employing the transition during the scan-in shift interval of the respective single cycle test pattern as a fault initialization cycle of a corresponding multicycle test pattern; and
    employing a pulse of a clock during a static capture cycle of the respective single static capture test pattern to capture a value downstream from the corresponding candidate fault and/or defect.

3. The medium of claim 2, wherein the scoring comprises comparing the single cycle test result data and fault simulation results for the faults and/or defects in a combination of the first set, the second set and the third set of static faults and/or defects to determine an order of probability that the set of miscompare values of the given single cycle test results are caused by a given static fault and/or defect and other static faults and/or defects.

4. The medium of claim 3, wherein each candidate fault and/or defect in the third set of static faults and/or defects is a multicycle cell-aware candidate defect.

5. The medium of claim 4, wherein each candidate fault and/or defect in the first set of static faults and/or defects and the second set of fault and/or defects is a single cycle candidate fault and/or defect.

6. The medium of claim 3, wherein the probability associated with the set of miscompare values is based on a comparison of the single cycle test result data and fault simulation results for a set of faults and/or defects against the given test pattern of the first and second subsets of the single cycle test patterns.

7. The medium of claim 6, wherein the diagnostics engine determines that probability of the set of miscompare values being caused by the static fault and/or defect of the third set of static faults and/or defects is greater than the probability of the set of miscompare values being caused by a static fault and/or defect of the first set of static faults and/or defects or the second set of static faults and/or defects.

8. The medium of claim 7, wherein the static fault and/or defect of the third set of static faults and/or defects is an open wire defect in the fabricated IC chip.

9. The medium of claim 6, wherein the comparison aggregates the fault simulation results and the single cycle test result data for two or more measures from a given test pattern of the first and second subsets of the single cycle test patterns.

10. The medium of claim 6, wherein the probability for a particular candidate fault and/or defect is increased or decreased based on a respective consistency or inconsistency between the single cycle test result data and fault-simulation of the particular candidate fault and/or defect.

11. A system comprising:
   automatic test equipment (ATE) that applies single cycle test patterns to a fabricated integrated circuit (IC) chip that is based on an IC design and provides single cycle test result data characterizing application of the single cycle test patterns to the fabricated IC chip, in which the test result data includes a set of miscompare values characterizing a difference between an expected result and a result measured by the ATE for a given single cycle test pattern of the single cycle test patterns;
   a non-transitory memory that stores machine-readable instructions; and
   a processing unit that accesses the memory and executes the machine-readable instructions, the machine-readable instructions comprising:
      an IC test engine that generates the single cycle test patterns for testing for candidate faults and/or defects of a first set of static faults and/or defects of the IC design; and
   a diagnostics engine that:
      employs a fault simulator to fault-simulate a subset of the single cycle test patterns against a fault model that includes multicycle static faults and/or defects utilizing sim-shifting to diagnose a second set of static faults and/or defects in the fabricated IC chip that are only detectable with multicycle test patterns; and
      scores candidate faults and/or defects in the first set of static faults and/or defects and the second set of static faults and/or defects for applicable test patterns of the subset of the single cycle test patterns to determine a most likely fault and/or defect present in the fabricated IC chip.

12. The system of claim 11, wherein the sim-shifting of the subset of the single cycle test patterns comprises:
   fault-simulating a scan-in shift interval of a respective single cycle test pattern of the subset of the single cycle test patterns to identify a transition upstream from a corresponding candidate fault and/or defect of the second set of static faults and/or defects in the fabricated IC chip;
   employing the transition during the scan-in shift interval of the respective single cycle test pattern as a fault initialization cycle of a corresponding multicycle test pattern; and
   employing a pulse of a clock during a static capture cycle of the respective single static capture test pattern to capture a value downstream from the corresponding candidate fault and/or defect.

13. The system of claim 12, wherein the scoring comprises comparing the single cycle test result data and fault simulation results for the faults and/or defects in a combination of the first set and second set of static faults and/or defects to determine an order of probability that the set of miscompare values of the given single cycle test results are caused by a given static fault and/or defect and other static faults and/or defects.

14. The system of claim 13, wherein the probability associated with the set of miscompare values is based on a comparison of the single cycle test result data and fault simulation results for a set of faults and/or defects against the given test pattern of the subset of the single cycle test patterns.

15. The system of claim 13, wherein the diagnostics engine determines that probability of the set of miscompare values being caused by a static fault and/or defect of the second set of static faults and/or defects is greater than the probability of the set of miscompare values being caused by a static fault and/or defect of the first set of static faults.

16. The system of claim 13, wherein the comparison aggregates the fault simulation results and the single cycle test result data for two or more measures from a given test pattern of the subset of the single cycle test patterns.

17. The system of claim 13, wherein the subset of single cycle test patterns is a first subset of single cycle test patterns, and the diagnostics engine:
   employs the fault simulator to fault-simulate a second subset of the single cycle test patterns against single cycle faults and/or defects to diagnose a third set of static faults and/or defects; and
   wherein the scoring further comprises scoring candidate faults and/or defects in the third set of static faults and/or defects for applicable test patterns of the second subset of the single cycle test patterns to determine a most likely fault and/or defect present in the fabricated IC chip.

18. A method for diagnosing faults and/or defects in a fabricated integrated circuit (IC) chip, the method comprising:
   generating, by an IC test engine operating on a computing platform, single cycle test patterns for testing for candidate faults and/or defects of a first set of static faults and/or defects of an IC design;
   applying, by automatic test equipment (ATE) the single cycle test patterns to a fabricated IC chip that is based on the IC design and provides single cycle test result data characterizing application of the single cycle test patterns to the fabricated IC chip, in which the test result data includes a set of miscompare values characterizing a difference between an expected result and a result measured by the ATE for a given single cycle test pattern of the single cycle test patterns;
   selectively fault-simulating, by a fault simulator of a diagnostics engine operating on the computing platform, a subset of the single cycle test patterns against a fault model that includes multicycle static faults and/or defects utilizing sim-shifting to diagnose a second set of static faults and/or defects in the fabricated IC chip that are only detectable with multicycle test patterns; and
   scoring, by the diagnostics engine candidate, faults and/or defects in the first set of static faults and/or defects and the second set of static faults and/or defects for applicable test patterns of the subset of the single cycle test patterns to determine a most likely fault and/or defect present in the fabricated IC chip.

19. The method of claim 18, wherein the sim-shifting of the subset of the single cycle test patterns comprises:
   fault-simulating a scan-in shift interval of a respective single cycle test pattern of the subset of the single cycle test patterns to identify a transition upstream from a corresponding candidate fault and/or defect of the second set of static faults and/or defects in the fabricated IC chip;

employing the transition during the scan-in shift interval of the respective single cycle test pattern as a fault initialization cycle of a corresponding multicycle test pattern; and employing a pulse of a clock signal during a static capture cycle of the respective single static capture test pattern to capture a value downstream from the corresponding candidate fault and/or defect.

20. The method of claim 18, wherein the scoring comprises comparing the single cycle test result data and fault simulation results for the faults and/or defects in a combination of the first set and the second set of static faults and/or defects to determine an order of probability that the set of miscompare values of the given single cycle test results are caused by a given static fault and/or defect and other static faults and/or defects.

* * * * *